United States Patent
Kawabe et al.

(10) Patent No.: US 9,590,639 B2
(45) Date of Patent: Mar. 7, 2017

(54) SEMICONDUCTOR DEVICE AND CONTROL METHOD

(71) Applicant: FUJITSU LIMITED, Kawasaki-shi, Kanagawa (JP)

(72) Inventors: Yukihito Kawabe, Kawasaki (JP); Michiharu Hara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 4 days.

(21) Appl. No.: 14/573,813

(22) Filed: Dec. 17, 2014

(65) Prior Publication Data

US 2015/0194969 A1 Jul. 9, 2015

(30) Foreign Application Priority Data

Jan. 7, 2014 (JP) ................. 2014-000912

(51) Int. Cl.
| | | |
|---|---|---|
| H03B 19/00 | (2006.01) | |
| H03L 7/00 | (2006.01) | |
| G05F 1/46 | (2006.01) | |
| G06F 1/20 | (2006.01) | |
| H03L 1/00 | (2006.01) | |
| H03L 1/02 | (2006.01) | |
| H03L 7/06 | (2006.01) | |

(52) U.S. Cl.
CPC ............. *H03L 7/00* (2013.01); *G05F 1/463* (2013.01); *G06F 1/206* (2013.01); *H03L 1/00* (2013.01); *H03L 1/022* (2013.01); *H03L 7/06* (2013.01)

(58) Field of Classification Search
USPC ........................................................ 327/114
See application file for complete search history.

(56) References Cited

U.S. PATENT DOCUMENTS

| 6,415,388 B1 * | 7/2002 | Browning ............... G06F 1/206 |
| | | 702/132 |
| 7,464,277 B2 * | 12/2008 | Prosperi ................. G06F 1/206 |
| | | 713/300 |
| 2014/0022003 A1 | 1/2014 | Inoue et al. |

FOREIGN PATENT DOCUMENTS

| JP | 2003-140782 | 5/2003 |
| JP | 2004-310785 | 11/2004 |
| JP | 2012-221301 | 11/2012 |

* cited by examiner

*Primary Examiner* — Lincoln Donovan
*Assistant Examiner* — Patrick Chen
(74) *Attorney, Agent, or Firm* — Staas & Halsey LLP

(57) ABSTRACT

A semiconductor device includes: a circuit configured to operate according to a clock; a temperature sensor configured to detect a temperature of the circuit; and a controller configured to control a frequency of the clock based on a temporal difference of power consumption of the circuit when the temperature detected by the temperature sensor exceeds a predetermined value.

5 Claims, 26 Drawing Sheets

FIG. 10

| ΔP/Δt (a.u) (EXPONENTIAL AVERAGE DIFFERENTIAL) | CORRESPONDING TEMPERATURE GRADIENT ΔP/Δt (°C/ms) | DIFFERENCE BETWEEN CURRENT TEMPERATURE AND STABLE TEMPERATURE (°C) |
|---|---|---|
| 7 | 0.20 | 35 |
| 6 | 0.171 | 30 |
| 5 | 0.141 | 26 |
| 4 | 0.115 | 22 |
| 3 | 0.089 | 18 |
| 2 | 0.066 | 15 |
| 1 | 0.044 | 11 |

FIG. 15A

| CODE | FREQUENCY (GHz) |
|---|---|
| 7 | 3.0 |
| 6 | 2.8 |
| 5 | 2.6 |
| 4 | 2.4 |
| 3 | 2.2 |
| 2 | 2.0 |
| 1 | 1.8 |

FIG. 15B

| CODE | FREQUENCY (GHz) | VOLTAGE |
|---|---|---|
| 7 | 3.0 | 1.1 |
| 6 | 2.8 | 1.05 |
| 5 | 2.6 | 1.0 |
| 4 | 2.4 | 1.0 |
| 3 | 2.2 | 1.0 |
| 2 | 2.0 | 1.0 |
| 1 | 1.8 | 1.0 |

FIG. 17

| ΔP/P | CURRENT FREQUENCY COD | | | | | | |
|---|---|---|---|---|---|---|---|
| | 1 | 2 | 3 | 4 | 5 | 6 | 7 |
| 6 | 1 | 1 | 1 | 1 | 1 | 1 | 1 |
| 5 | 1 | 1 | 1 | 1 | 1 | 1 | 1 |
| 4 | 1 | 1 | 1 | 1 | 1 | 1 | 2 |
| 3 | 1 | 1 | 1 | 1 | 1 | 2 | 3 |
| 2 | 1 | 1 | 1 | 1 | 2 | 3 | 4 |
| 1 | 1 | 1 | 1 | 2 | 3 | 4 | 5 |
| 0 | 1 | 1 | 2 | 3 | 4 | 5 | 6 |

FIG. 18

| ΔP/P | CURRENT FREQUENCY COD | | | | | | |
|---|---|---|---|---|---|---|---|
| | 1 | 2 | 3 | 4 | 5 | 6 | 7 |
| -6 | 7 | 7 | 7 | 7 | 7 | 7 | 7 |
| -5 | 7 | 7 | 7 | 7 | 7 | 7 | 7 |
| -4 | 6 | 7 | 7 | 7 | 7 | 7 | 7 |
| -3 | 5 | 6 | 7 | 7 | 7 | 7 | 7 |
| -2 | 4 | 5 | 6 | 7 | 7 | 7 | 7 |
| -1 | 3 | 4 | 5 | 6 | 7 | 7 | 7 |
| 0 | 2 | 3 | 4 | 5 | 6 | 7 | 7 |

FIG. 19

| ΔP/P | CURRENT FREQUENCY COD | | | | | | |
|---|---|---|---|---|---|---|---|
| | 1 | 2 | 3 | 4 | 5 | 6 | 7 |
| 6 | 0 | 0 | 0 | 0 | 0 | 0 | 1 |
| 5 | 0 | 0 | 0 | 0 | 0 | 1 | 1 |
| 4 | 0 | 0 | 0 | 0 | 1 | 1 | 2 |
| 3 | 0 | 0 | 0 | 1 | 1 | 2 | 3 |
| 2 | 0 | 0 | 1 | 1 | 2 | 3 | 4 |
| 1 | 0 | 1 | 1 | 2 | 3 | 4 | 5 |
| 0 | 1 | 1 | 2 | 3 | 4 | 5 | 6 |

0: FREQUENCY FOR EMERGENCY LOAD REDUCTION,
WHICH IS LOWER THAN NORMALLY USED
FREQUENCY RANGE

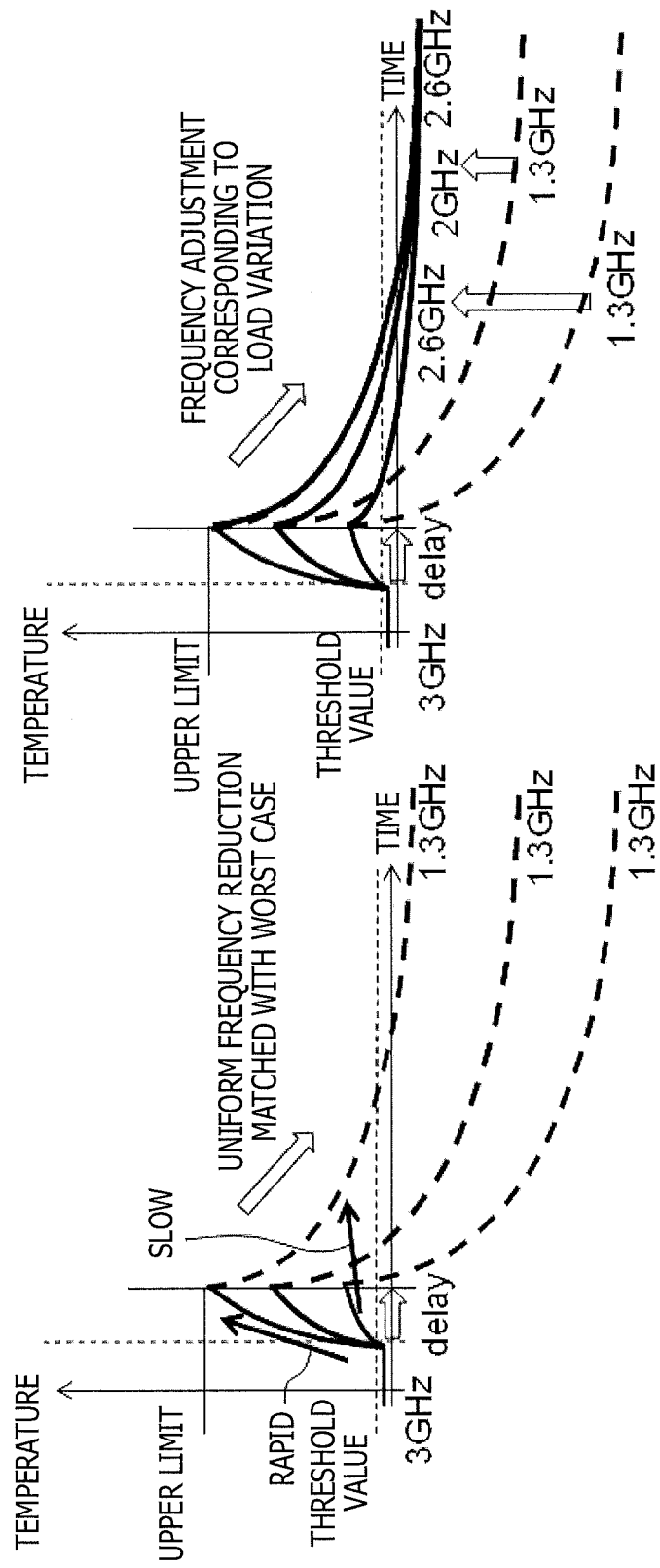

SEMICONDUCTOR DEVICE AND CONTROL METHOD

CROSS-REFERENCE TO RELATED APPLICATION

This application is based upon and claims the benefit of priority of the prior Japanese Patent Application No. 2014-000912 filed on Jan. 7, 2014, the entire contents of which are incorporated herein by reference.

FIELD

The embodiments discussed herein are related to a semiconductor device and a control method thereof.

BACKGROUND

As the performance of microprocessors improves, the power consumption tends to increase year by year, so that a problem surfaces where a semiconductor device such as a processor is difficult to be run with a maximum load that is allowed in the specification due to an upper limit of power supply performance and an upper limit of chip temperature. Hereinafter, a case in which, as a semiconductor device, a processor (CPU) is used as an example will be described.

The processor is requested to run so as not to exceed a power consumption upper limit and a temperature upper limit, and when the processor exceeds these limits, a malfunction may occur due to a signal delay and the like. Therefore, when the processor may exceed the power consumption upper limit and/or the temperature upper limit during normal operation, load is adjusted so as not to exceed the limits. As methods of adjusting the load, dynamic frequency scaling (DFS) and dynamic voltage and frequency scaling (DVFS) are known. The DFS is a method that changes the load by dynamically changing a clock frequency. The DVFS is a method that further reduces the power consumption by lowering an operating voltage by a voltage corresponding to a timing margin generated by lowering the clock frequency.

When performing the aforementioned methods, it is desirable that the processor is operated at high clock frequency as much as possible within a range not exceeding the upper limit of the load from a viewpoint of performance of the processor. As a method that causes the processor to operate at high clock frequency as much as possible within a range not exceeding the upper limit of the load, a method is generally performed in which a control threshold value is set below an upper limit value and when the load exceeds the threshold value, control to lower the clock frequency or a power supply voltage is started. Thereby, the clock frequency or the power supply voltage lowers, and the load reduces accordingly. When the temperature of the processor (LSI) is an operating restriction, a temperature threshold value for control is set, and when the temperature of the processor exceeds the temperature threshold value, the clock frequency is lowered. However, in a case in which the clock frequency is lowered when the temperature exceeds the temperature threshold value, there is a delay until the clock frequency actually lowers, so that the temperature rises continuously during that time.

In this control, if the temperature threshold value is lowered, the performance of the processor is generally lowered, so it is desirable that the temperature threshold value is close to the upper limit temperature as much as possible. However, if the temperature threshold value is too close to the upper limit temperature, there may be a case in which the temperature exceeds the upper limit temperature in a period of time from when the temperature of the processor exceeds the temperature threshold value to when the clock frequency is lowered. Therefore, it is requested that the temperature threshold value is lowered by a value corresponding to a temperature rise during a delay time used for the frequency control.

A case in which the maximum temperature rise estimated in the above temperature control occurs is a case in which the power consumption changes to the maximum value in a stepwise manner by load variation. In this case, when the temperature exceeds the temperature threshold value, it is requested to lower the clock frequency to a clock frequency at which the temperature is lower than the upper limit temperature even when the maximum power is consumed.

If the power when the temperature exceeds the temperature threshold value is smaller than the maximum power consumption, the clock frequency does not have to be lowered in the manner as described above. However, when the frequency control is performed based on only detected temperatures, it is difficult to determine how much the temperature will rise eventually at the time point when the temperature exceeds the temperature threshold value, so that the frequency is lowered to the aforementioned frequency at all times so that the temperature does not exceed the upper limit even when the load variation is maximum. Therefore, such control causes degradation of performance.

As a countermeasure against the above, it is possible to indirectly estimate the temperature change by setting two temperature threshold values and measuring a temporal difference between times when the temperature exceeds the respective threshold values. However, in this case, a threshold temperature is lowered and a control delay increases in practice, so that the general performance of the processor degrades.

On the other hand, when the load decreases and temperature margin increases, to increase the frequency, a control is considered in which a threshold value for frequency control is set in the same manner as described above and the clock frequency is increased when the temperature falls below the threshold value. However, also in this case, it is difficult to determine how much the temperature will fall eventually by only temperatures at the time point when the temperature falls below the threshold value. Specifically, there may be a case in which the clock frequency is increased too much and the temperature exceeds the temperature upper limit. To avoid the above problem, the clock frequency is gradually increased. However, in such control, it takes time until an appropriate clock frequency is reached, so that the performance of the processor is uselessly degraded during that time.

To avoid such useless degradation of performance, a configuration is considered in which the power consumption is monitored instead of the temperature and the clock frequency is switched according to the value of power consumption. However, there are the following problems:

(1) A temperature restriction, which is an operating restriction, is converted into a power value by using a thermal resistance value which is the rating of the system and control is performed, so that a conversion error margin corresponding to a difference between the thermal resistance value and an actual thermal resistance is generated as compared with control directly using temperatures. The margin is considered, so that it is difficult to perform accurate control.

(2) In power control, an upper limit power corresponding to the upper limit temperature is set in advance. Therefore, even if the peripheral temperature changes and the temperature margin changes, the upper limit power does not follow the change of the temperature margin, so that it is not possible to follow the change of power margin accompanying the change of peripheral temperature.

As described above, the control based on the power consumption causes degradation of general performance due to various control margins. Further, it can be considered to perform control by using both temperature and power consumption observed by a temperature monitor and a power monitor. However, there is a problem that the control is complicated.

As described above, there is a semiconductor device such as a microprocessor, which has a sufficient power supply capacity but has a strict operation guarantee temperature condition and which has an operating condition in which an upper limit restriction of a junction temperature of the chip determines a maximum allowable load. In such a semiconductor device, it is desired to reduce the degradation of performance by controlling the clock frequency and further the power supply voltage if desired so that the chip temperature does not exceed the upper limit temperature.

The followings are reference documents:
[Document 1] Japanese Laid-open Patent Publication No. 2004-310785,
[Document 2] Japanese Laid-open Patent Publication No. 2012-221301 and
[Document 3] Japanese Laid-open Patent Publication No. 2003-140782.

SUMMARY

According to an aspect of the invention, a semiconductor device includes: a circuit configured to operate according to a clock; a temperature sensor configured to detect a temperature of the circuit; and a controller configured to control a frequency of the clock based on a temporal difference of power consumption of the circuit unit when the temperature detected by the temperature sensor exceeds a predetermined value.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8A illustrates variation of the exponential moving average and the temporal difference of the exponential moving average when the power step-changes, and FIG. 8B illustrates exponential weighting of time series data;

FIG. 10 is a table illustrating an example of a temperature change speed and a temperature variation amount corresponding to the temporal difference of the exponential moving average;

FIGS. 15A and 15B are diagrams illustrating an example of a table for deriving a clock frequency of PLL which is finally adjusted;

FIG. 17 illustrates a frequency conversion table used for control to lower a clock frequency;

FIG. 18 illustrates a table used for control to raise a clock frequency;

FIG. 19 illustrates an example of a table used to quickly lower a frequency;

FIGS. 22A and 22B are diagrams for explaining effects of control of the embodiment in a case in which the temperature rises to exceed a temperature threshold value and the clock frequency is lowered, FIG. 22A illustrates a temperature variation in a case in which control is performed using only temperature, and FIG. 22B illustrates a temperature variation in a case of the control of the embodiment;

FIG. 23A illustrates a temperature variation in a case in which control is performed using only temperature, and FIG. 23B illustrates a temperature variation in a case of the control of the embodiment;

DESCRIPTION OF EMBODIMENTS

Before describing the embodiments, a general frequency/voltage control technique will be described which adjusts a clock frequency and further a power supply voltage if desired so that a semiconductor device achieves high performance within a range in which a chip temperature does not exceed a limit temperature. In the description below, a case in which, as a semiconductor device, a processor (CPU) is used as an example will be described.

As described above, in a situation in which the processor may exceed the power consumption upper limit and/or the temperature upper limit during normal operation, as methods that adjust load so that the processor does not exceed these limits, the DFS that dynamically changes the clock frequency and the DVFS that reduces the power consumption by lowering a power supply voltage are known. Hereinafter, the dynamic change of the clock frequency will be mainly described. However, the power supply voltage is controlled in the same manner.

As a method that causes the processor to operate at high clock frequency as much as possible within a range not exceeding the upper limit of the temperature, a method is known in which a control threshold value is set below an upper limit value and when the temperature exceeds the threshold value, control to lower the clock frequency and/or the power supply voltage is started. Even if an instruction to lower the clock frequency and/or the power supply voltage is issued, there is a delay until the load actually lowers and the temperature rises during the delay. Therefore, when starting reduction of the load by lowering the clock frequency (and the power supply voltage) when the temperature exceeds a threshold value lower than the upper limit value, the clock frequency (and the power supply voltage) is lowered and the load is reduced by the time the temperature reaches the upper limit value even if there is the delay.

Figure 1:
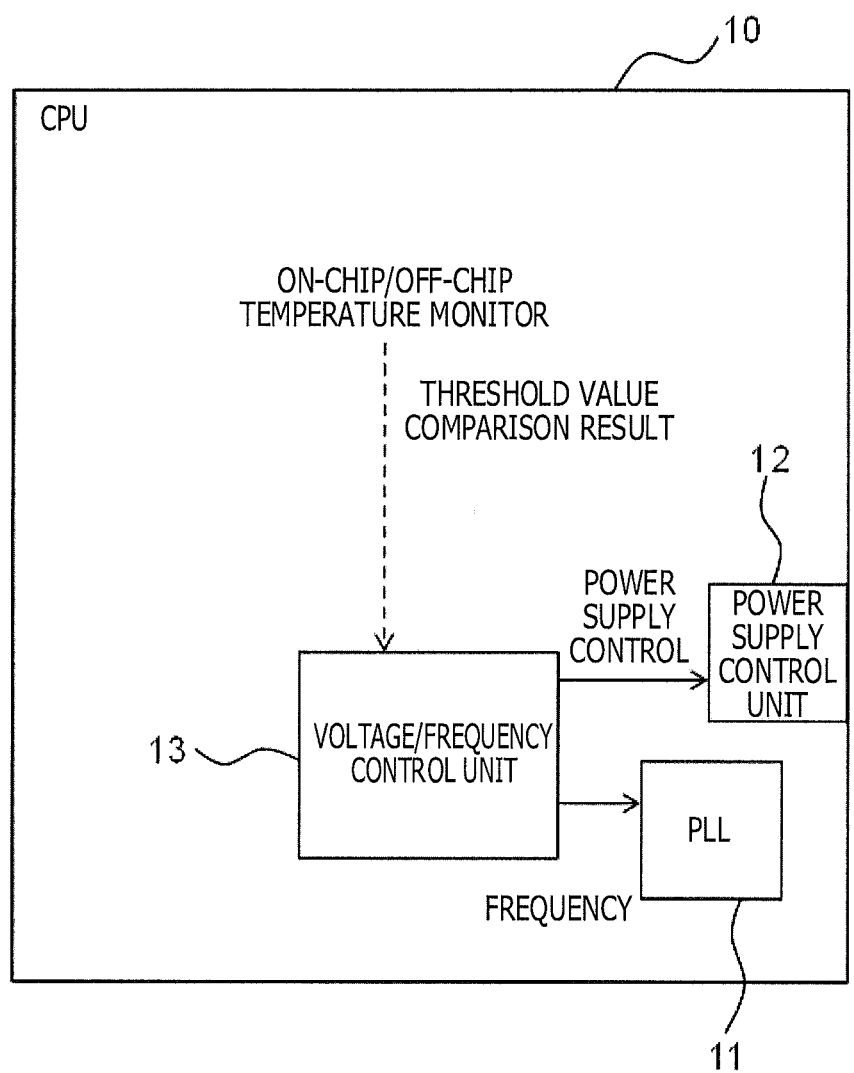
FIG. 1 is a diagram illustrating a configuration of a general semiconductor device (processor: CPU) that performs DVFS control.

FIG. 1 is a diagram illustrating a configuration of a general semiconductor device (processor: CPU) that performs DVFS control.

The CPU 10 includes a PLL circuit 11 that generates an internal clock, a power supply control unit 12 that controls voltage generated by an internal power supply (not illustrated in FIG. 1), and a voltage/frequency control unit 13. A temperature monitor is provided inside the chip (on-chip) or outside the chip (off-chip). The temperature monitor detects temperature of the chip (CPU), compares whether the detected temperature is higher than a temperature threshold value, and supplies a comparison result to the voltage/frequency control unit 13. When the voltage/frequency control unit 13 receives a comparison result indicating that the detected temperature is higher than the temperature threshold value, the voltage/frequency control unit 13 lowers the frequency of the clock generated by the PLL 11 and outputs an instruction to cause the power supply control unit 12 to lower the power supply voltage.

When the temperature threshold value is lowered, the performance of the CPU is generally lowered. Therefore, it is desirable that the temperature threshold value is set to a value close to the upper limit temperature as much as possible. However, if the temperature threshold value is too close to the upper limit temperature, the temperature exceeds the upper limit temperature in a period of time from when the temperature exceeds the threshold value to when the frequency (and the power supply voltage) is lowered, so that the temperature threshold value is set by considering a temperature rise during the delay of the frequency control (and the power supply voltage control).

Figure 2:
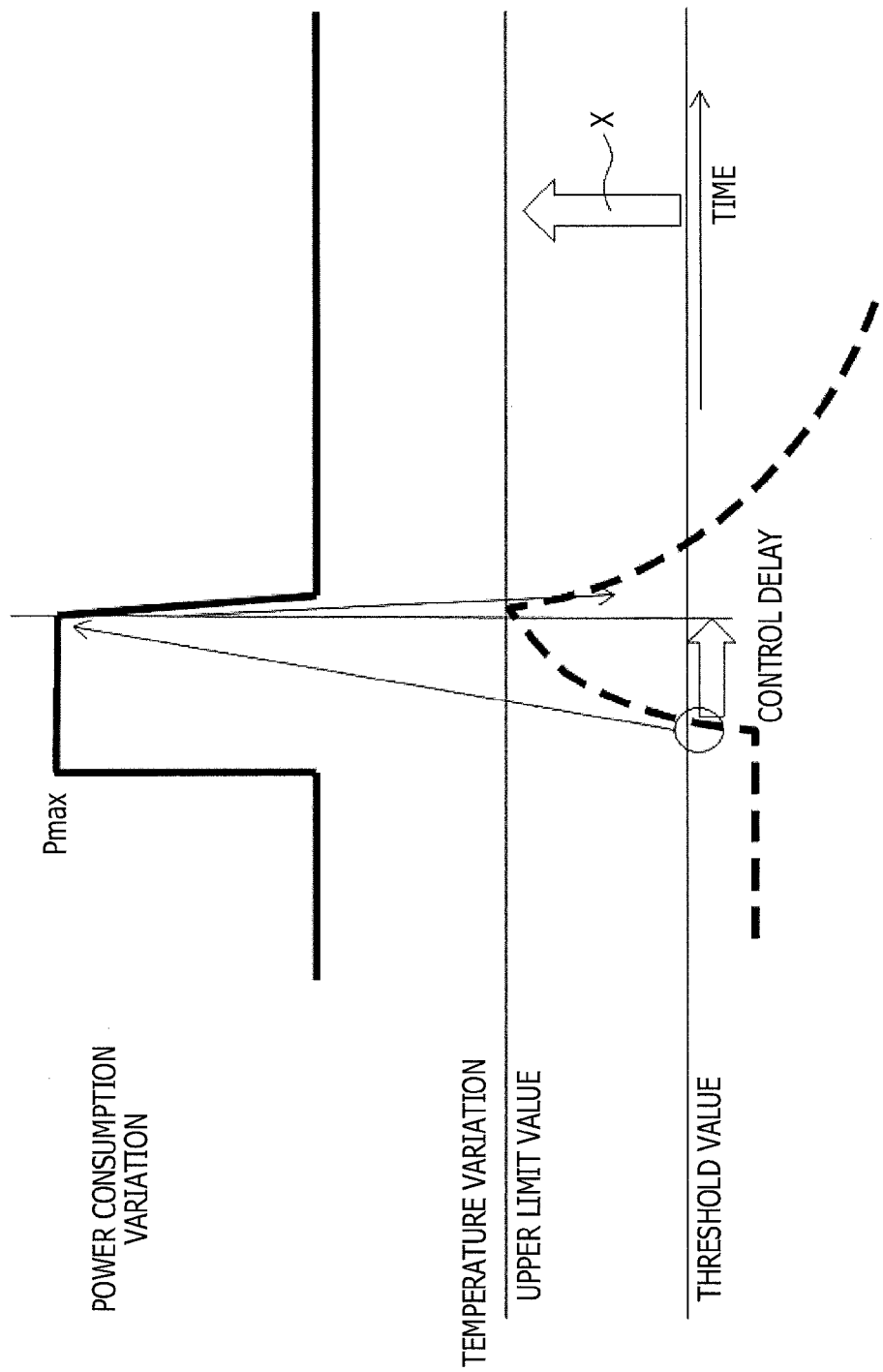
FIG. 2 is a diagram illustrating power and temperature variation examples according to time course when the temperature rises and exceeds a threshold value due to increase of power.

FIG. 2 is a diagram illustrating power and temperature variation examples according to time course when the temperature rises and exceeds the threshold value due to increase of power. In FIG. 2, a thick solid line represents the power consumption, a thick dashed line represents the temperature, and thin solid lines represent the upper limit value of the temperature and the temperature threshold value.

A case in which the temperature control is the worst (the worst case) is, as illustrated in FIG. 2, a case in which the power changes to the maximum value Pmax in a stepwise manner by load variation. In this case, it is requested to lower the clock frequency to a clock frequency (referred to as Fmin) at which the temperature is lower than the upper limit value even when the power consumption is the worst. Therefore, when the temperature exceeds the temperature threshold value, an instruction to lower the clock frequency to Fmin is issued. However, there is a control delay until the clock frequency is actually lowered and the temperature actually lowers. Therefore, the temperature rises after exceeding the temperature threshold value. Therefore, the temperature threshold value is set by considering the allowance for the rise in temperature (indicated by X) during the delay requested by the frequency control (and the power supply control).

In the above case, if the power in a case in which the temperature exceeds the threshold value is smaller than Pmax (not in the worst case), the clock frequency is not requested to be lowered to Fmin. However, when the frequency control is performed based on the temperature, it is difficult to determine how much the temperature will rise eventually at the time point when the temperature exceeds the temperature threshold value, so that the frequency is lowered to Fmin at all times so that the temperature does not exceed the upper limit even when the load variation is the worst.

It is possible to indirectly estimate the temperature change by setting two temperature threshold values and measuring a temporal difference between times when the temperature exceeds the respective threshold values. However, in this case, a threshold temperature is lowered and a control delay increases in practice, so that there is a problem that the general performance degrades.

On the other hand, when the load decreases and temperature margin increases, to increase the clock frequency, a control is considered in which a lower temperature threshold value for frequency control is set in the same manner as in the control to lower the clock frequency and the clock frequency is increased when the temperature falls below the lower temperature threshold value. However, also in this case, it is difficult to determine how much the temperature will fall eventually by only temperatures at the time point when the temperature falls below the lower temperature threshold value. Therefore, to avoid a case in which the clock frequency is raised too much and the temperature exceeds the upper limit value of the temperature, the frequency is gradually raised, so that it takes time until an appropriate frequency is reached and a low performance state uselessly continues during that time.

Figure 3:
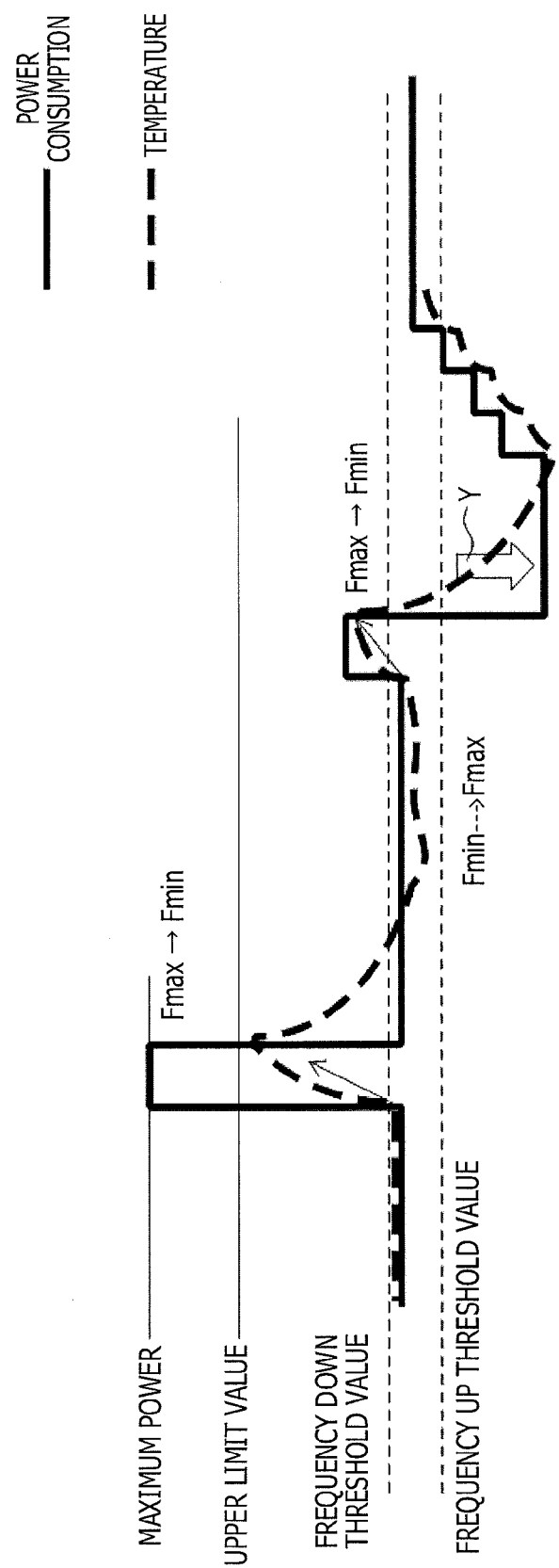
FIG. 3 is a diagram for explaining a problem that the clock frequency is lowered to a clock frequency at which the temperature falls below an upper limit value at worst when the temperature exceeds the threshold value.

FIG. 3 is a diagram for explaining a problem that the clock frequency is lowered to Fmin when the temperature exceeds the temperature threshold value. In FIG. 3, a thick solid line represents the power consumption, a thick dashed line represents the temperature, a thin solid line represents the upper limit value of the temperature, and thin dashed lines represent a down threshold value and an up threshold value of the clock frequency.

As illustrated in FIG. 3, when the power increases greatly, the temperature exceeds the temperature threshold value and accordingly the clock frequency is changed from Fmax to Fmin, so that the temperature rises close to the upper limit value and then falls, and the temperature falls below the temperature threshold value. Therefore, the clock frequency is changed from Fmin to Fmax. However, the temperature exceeds the temperature threshold value even when the increase of the power is small, so that the clock frequency is changed from Fmax to Fmin. In this case, the temperature rises a little and then begins to fall. The power decreases greatly by the decrease of the clock frequency to Fmin, so that the temperature further falls from a relatively low temperature. Therefore, the clock frequency is increased and the power consumption gradually increases. However, it takes a long time for the temperature to rise close to the temperature threshold value. During this time, the processor operates at a performance lower than originally obtainable performance, so that it causes degradation of the performance of the processor.

To avoid such useless degradation of performance, a configuration is considered in which the power consumption is monitored instead of the temperature and the clock frequency is switched according to the value of power consumption. However, there are the aforementioned problems. Therefore, general performance is degraded due to various control margins. Further, it can be considered to perform temperature control by using the power consumption observed by a power monitor or the like when the temperature exceeds the threshold value. However, the problems are not solved by only the above control and it is not possible to perform good control.

In the embodiment described below, useless performance degradation caused by the frequency control when the temperature crosses the control threshold value (temperature threshold value) due to increase of load and decrease of load is suppressed in the frequency control by the temperature described above, and transitional performance in the temperature control is improved.

Figure 4:
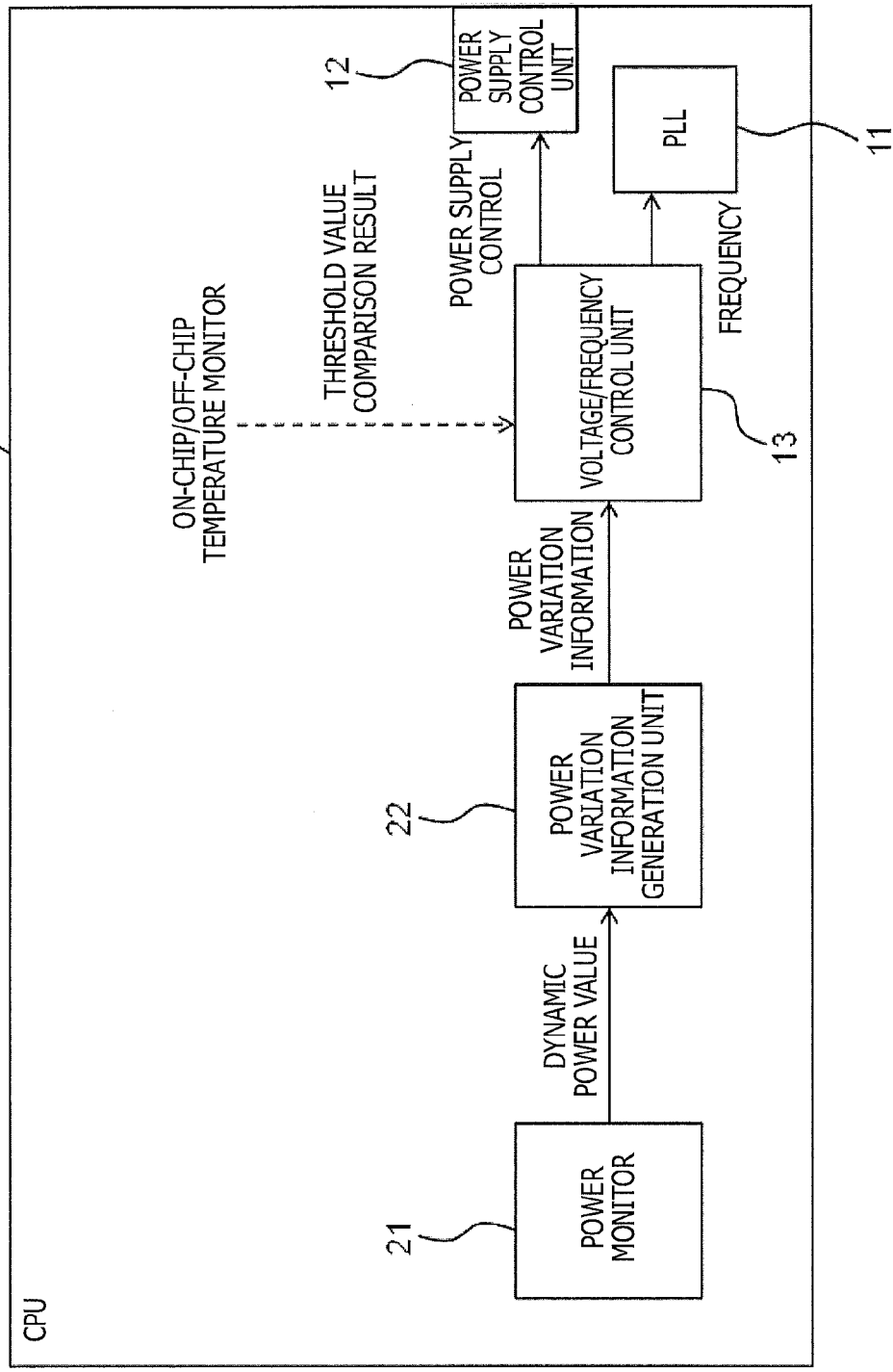
FIG. 4 is a diagram illustrating a configuration of a semiconductor device (a chip, here, a processor: CPU) of an embodiment, which performs DVFS control.

FIG. 4 is a diagram illustrating a configuration of a semiconductor device (a chip, here, a processor: CPU) of the embodiment, which performs DVFS control.

The CPU 10 of the embodiment includes a PLL circuit 11, a power supply control unit 12, a voltage/frequency control unit 13, a power monitor 21, and a power variation information generation unit 22. The PLL circuit 11 generates an internal clock. The PLL circuit 11 is the same as the PLL of the general CPU illustrated in FIG. 1. The power supply control unit 12 controls a voltage generated by an internal power supply (not illustrated in FIG. 4). The power supply control unit 12 is the same as the power supply control unit of the general CPU illustrated in FIG. 1. Also in the embodiment, a temperature monitor is provided inside the chip (on-chip) or outside the chip (off-chip). The temperature monitor detects temperature of the chip (CPU), compares whether the detected temperature is higher than the temperature threshold value, and supplies a comparison result to the voltage/frequency control unit 13.

The power monitor 21 is an activity-counter-based module that roughly estimates a dynamic power value from a count value of main operation information of each chip. The power variation information generation unit 22 periodically collects dynamic power values from the power monitor 21, generates power variation information used for the frequency control based on temporal variation information of the dynamic power values, and transmits the power variation information to the voltage/frequency control unit 13. The voltage/frequency control unit 13 obtains an optimal frequency based on the power variation information at a time point when the temperature crosses the threshold value by using a threshold value comparison result (temperature information) as an input, controls the PLL 11 and the power supply control unit 12 based on the optimal frequency, and controls the clock frequency and the power supply voltage.

The semiconductor device (CPU) 10 of the embodiment is a microprocessor which has a sufficient power supply capacity but has a strict operation guarantee temperature condition and which has an operating condition in which an upper limit restriction of a junction temperature of the chip determines a maximum allowable load of the processor. In such a processor, degradation of performance in the frequency control in a case in which the clock frequency is lowered so that the chip temperature does not exceed the temperature threshold value and in a case in which the clock frequency is raised when the chip temperature falls below the temperature threshold value is suppressed low, and the performance of the processor is improved.

Figure 5:
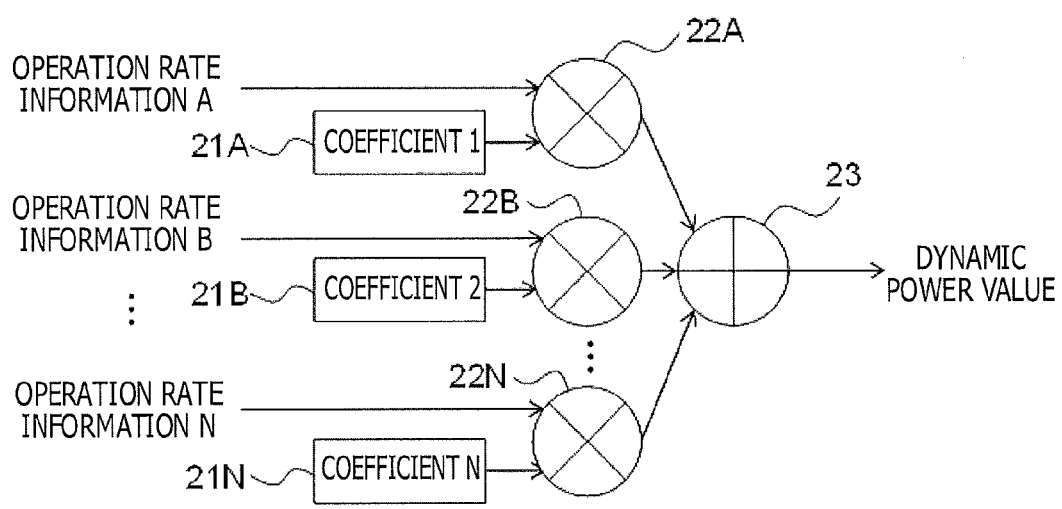
FIG. 5 is a diagram illustrating an example of a circuit that performs processing of a power monitor.

FIG. 5 is a diagram illustrating an example of a circuit that performs processing of the power monitor 21.

The power monitor 21 includes a plurality of (here, N) registers 21A to 21N, a plurality of multipliers 22A to 22N, and an adder 23. The power monitor 21 acquires operation rate information A-N of a signal having a high correlation with the power consumption of each unit of the chip, multiplies the operation rate information by appropriate weight coefficients stored in the registers 21A to 21N by the multipliers 22A to 22N, and calculates the sum of the multiplication results by the adder 23. The sum approximately corresponds to the dynamic power value of the chip.

Next, the power variation information generated by the power variation information generation unit 22 will be described. The power value corresponding to the temperature threshold value and the upper limit value changes according to variation of a peripheral temperature, so that it is not possible to use the power value itself to adjust the frequency. Therefore, information indicating a short time power variation immediately before the temperature exceeds the threshold value is generated and the information is used as the power variation information.

Figure 6:
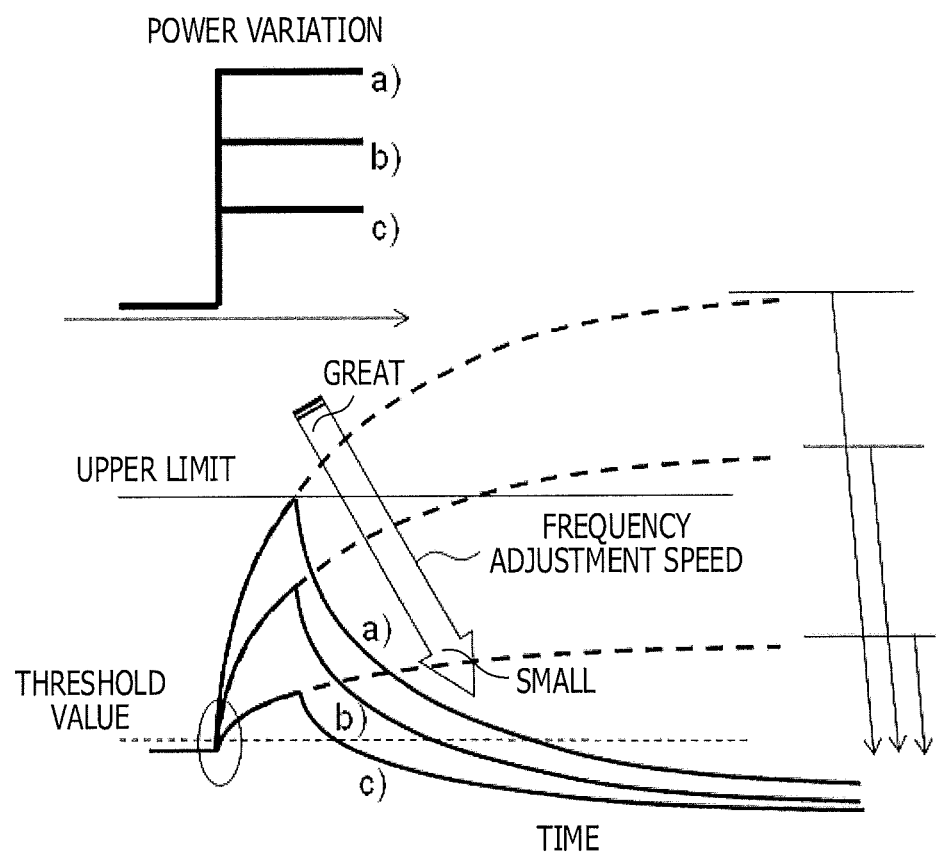
FIG. 6 is a diagram illustrating an example of temporal variation of temperature from the same temperature by different step-shaped power variation amounts.
Figure 7:
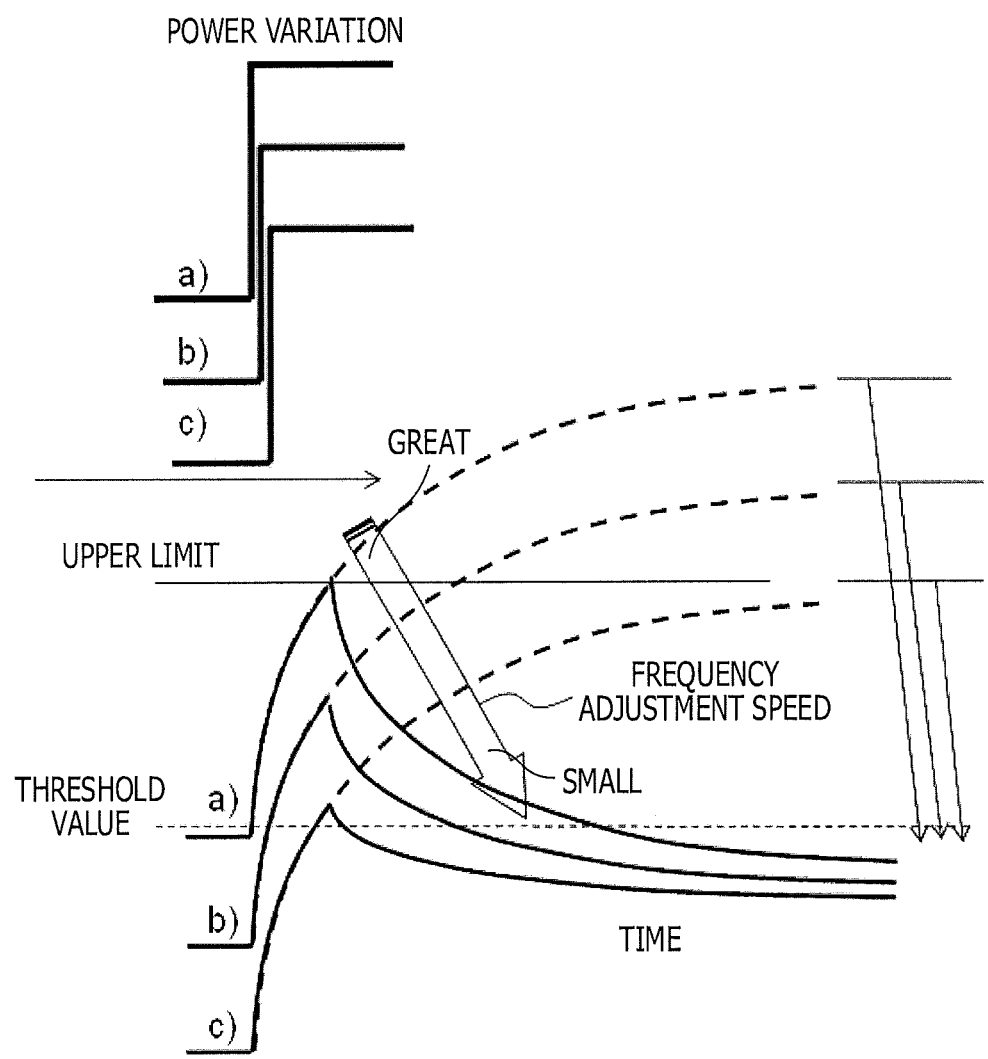
FIG. 7 is a diagram illustrating an example of temporal variation of temperature from different temperatures by the same step-shaped power variation amount.

FIGS. 6 and 7 are diagrams illustrating an example of temporal variation of the temperature due to step-shaped power variations. FIG. 6 illustrates a case in which different power variation amounts are generated in the same temperature. FIG. 7 illustrates a case in which the same power variation amount is generated in the different temperatures.

In FIG. 6, the temperature rises according to the power variation amounts (a) to (c) from the same temperature. While the temperatures are rising, if the load (clock frequency) is lowered, the temperatures fall as indicated by solid lines. While the temperatures are rising, if the load (clock frequency) is not lowered, the temperatures rise as indicated by dashed lines.

The same goes for FIG. 7. When the temperatures before the change are the same, it is considered that the power consumptions are the same. It is considered that the greater the power variation amount, the greater the amount of increase of the clock frequency, and the smaller the power variation amount, the smaller the amount of increase of the clock frequency. When the temperatures exceed the temperature threshold value, the clock frequency is decreased in any case. However, if it is controlled so that the higher the temperature, the greater the amount of decrease of the clock frequency (power consumption), and the lower the temperature, the smaller the amount of decrease of the clock frequency (power consumption), the temperatures fall to temperatures close to each other. Therefore, in the case of FIG. 6, it seems that a power variation amount between power samples in a certain period may be outputted in chronological order as the power variation information.

However, as illustrated in FIG. 7, when the temperatures at the beginning of the power variation are different from each other, the temperature variations after the temperatures exceed the threshold value are different even when the power variation amounts are the same. Therefore, if the same frequency adjustment amount is instructed, the temperature uselessly falls when the power variation is started at a low temperature. Therefore, it is desirable that a frequency adjustment amount according to the temperature variation after the temperature exceeds the threshold value is instructed.

Specifically, when the temperature variation after the temperature exceeds the threshold value is large and the temperature rises to a high temperature, the amount of decrease of the clock frequency (power consumption) is set to a large amount, and when the temperature variation after the temperature exceeds the threshold value is small and the temperature rises to a low temperature, the amount of decrease of the clock frequency (power consumption) is set to a small amount. Therefore, a mere power variation amount of a certain fixed period is insufficient as the power variation information. Therefore, in the embodiment, as the power variation information (frequency adjustment amount), a temporal difference of the power, specifically, temporal difference (difference between adjacent samples) information of an exponential moving average of time series samples of the power is used.

Figure 8A:
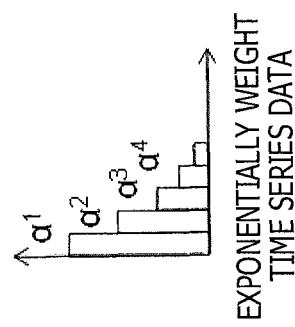
FIGS. 8A and 8B are diagrams for explaining an exponential moving average of time series samples of power and a temporal difference of the exponential moving average.
Figure 8B:
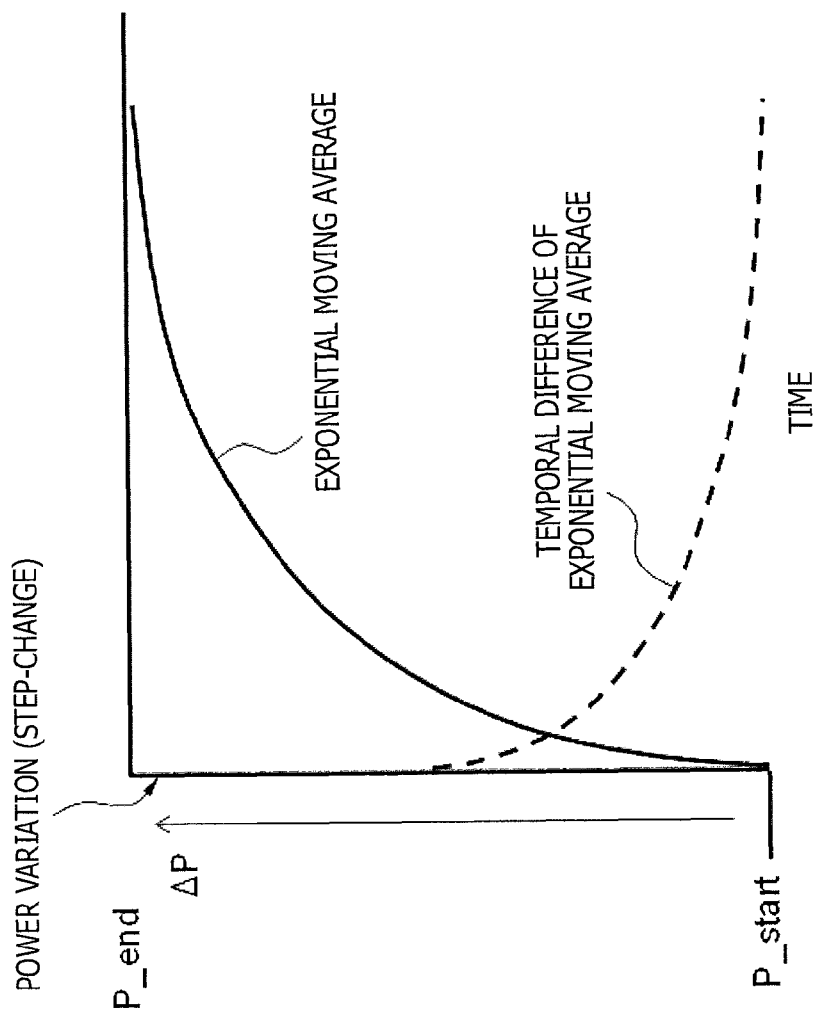

FIGS. 8A and 8B are diagrams for explaining the exponential moving average of time series samples of the power and the temporal difference of the exponential moving average. FIG. 8A illustrates variation of the exponential moving average and the temporal difference of the exponential moving average when the power step-changes. FIG. 8B illustrates exponential weighting of time series data.

The exponential moving average is a type of moving average. As illustrated in FIG. 8B, the exponential moving average is calculated by weighting power samples in a certain past period with exponential weights such as $\alpha^1$, $\alpha^2$, $\alpha^3$, and so on along time series and calculating an average of the weighted power samples. For example, as illustrated in FIG. 8A, when the exponential moving average of power values step-changed from P_start to P_end is calculated, a curve $((P\_end-P\_start)(1-e^{(-t/\tau)}))$ having characteristics of first-order lag of power change is obtained. Here, $\tau$ is a time constant determined by a radix of exponential weight. In this formula, when a time derivative (that is, a temperature change speed) when the temperature exceeds the temperature threshold value is calculated and ordered, (P_end−P_th)/$\tau$ is obtained, which is a value proportional to a difference $\Delta$P between a power P_th corresponding to the threshold temperature and a steady power P_end after change. In other words, when using the power variation value $\Delta$P, a current power consumption P, and a current frequency f, a frequency adjustment amount from the current frequency f for causing the power consumption to approach P_th can be obtained as $\Delta f=-f\Delta P/P$.

This formula is established in both cases of P_start<P_end and P_start>P_end, so that this formula can be used for control in both cases in which the temperature exceeds an upper limit side temperature threshold value and in which the temperature falls below a lower limit side temperature threshold value.

When an exponential moving average E(t) is represented by a recurrence formula, the exponential moving average E(t) is can be represented as follows by using a certain constant $\alpha$ (0<$\alpha$<1) and a power consumption P(t).

$$E(t)=(1-\alpha)P(t)\Delta t+\alpha E(t-1)$$

Here, $\alpha$ is a radix of exponential weight of the exponential moving average.

This formula is also a recurrence formula representing a temperature when the power P(t) is given in a system having an internal heat capacity and a thermal resistance to a heat dissipation unit, so that it can be considered that temperature information is roughly estimated from time series information of power consumption by a process called the exponential moving average. Therefore, even for a non-step-response power change, this formula becomes an index indicating a variation close to a temperature change, and a derivative value of the power change at the temperature threshold value can be assumed to be a temperature change speed at a time point when the temperature exceeds the threshold value.

Figure 9:
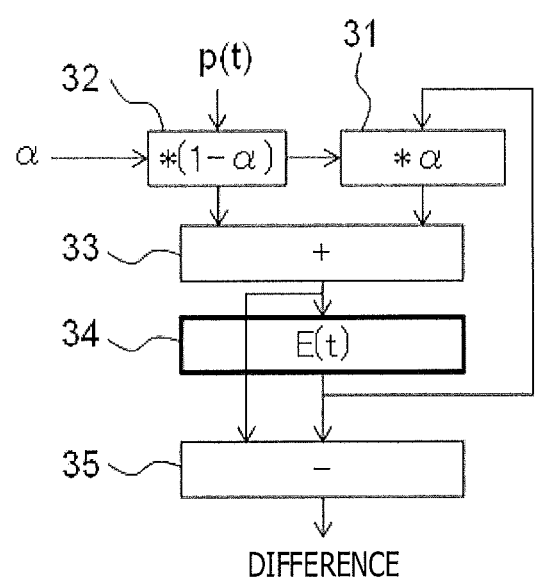
FIG. 9 is a diagram illustrating a schematic configuration of a circuit that generates the temporal difference of the exponential moving average.

FIG. 9 is a diagram illustrating a schematic configuration of a circuit that generates the temporal difference of the exponential moving average.

The circuit includes a multiplier 31 that multiplies an exponential moving average value E(t) by a coefficient $\alpha$, a multiplier 32 that multiplies a power value P(t) by a coefficient 1−$\alpha$, an adder 33 of outputs of the two multipliers, a register 34 that holds E(t), and a subtracter 35 that calculates a difference between outputs of the adder 33 and the register 34. In the circuit, the multiplier 32 uses the power value P(t) that is periodically updated as an input and multiplies the power by (1−$\alpha$) (0<$\alpha$<1), the multiplier 31 multiplies the exponential moving average value E(t) at the time by $\alpha$, and the adder 33 adds outputs of the two multipliers 31 and 32. Here, $\alpha$ is a parameter that determines a time constant of the exponential moving average. In the present embodiment, $\alpha$ is determined so as to have characteristics close to a thermal time constant determined by the LSI 10 and a heat conductive material or the like between the LSI and a package, so that it is possible to obtain characteristics coping with a rapid change of temperature in the chip. It is possible to simplify the multiplier circuits 31 and 32 by setting $\alpha$ and 1−$\alpha$ to an exponent of ½ which is closest to an ideal value.

FIG. 10 is a table illustrating an example of a temperature change speed and a temperature variation amount corresponding to the temporal difference of the exponential moving average.

In FIG. 10, $\Delta$P(t)/$\Delta$t is a value of three most significant bits of an output value of a difference circuit of the exponential moving average in FIG. 9. For example, it is indicated that when the power variation information obtained at a time point when the temperature exceeds the threshold value is 5, the temperature change speed at the time is a value around 0.141 (° C./ms) and a difference between the power corresponding to the threshold value and an actual power is about 26 W. The number of bits that represent the exponential moving average is finite, so that when the power is fixed for a certain period of time, the exponential moving average converges eventually and the difference value becomes zero. When a difference value 0 is inputted, adjustment is continued within a predetermined small variation range.

To output an effective value in a wide time domain, it is requested to increase the number of bits of the register that stores the exponential moving average and then increase the time constant by adjusting $\alpha$. It is also possible to obtain an effective value in a wide time domain by dividing a range where the delay is requested to be measured into a plurality of areas and calculating the exponential moving average for each area.

Next, a control method in the voltage/frequency control unit 13 will be described. The voltage/frequency control unit 13 observes a comparison result between a temperature sensor and the temperature threshold value at all times and performs adjustment as described below every time the temperature exceeds the temperature threshold value. As described above, the control method can be used when increasing the frequency and when decreasing the frequency. Therefore, for example, two threshold values are prepared, which are a temperature threshold value T_down for lowering the temperature and a temperature threshold value T_up for raising the temperature, and when the temperature exceeds T_down and when the temperature falls below T_up, the frequency control is performed by using the control method described below. T_down and T_up may be the same value.

Figure 11:
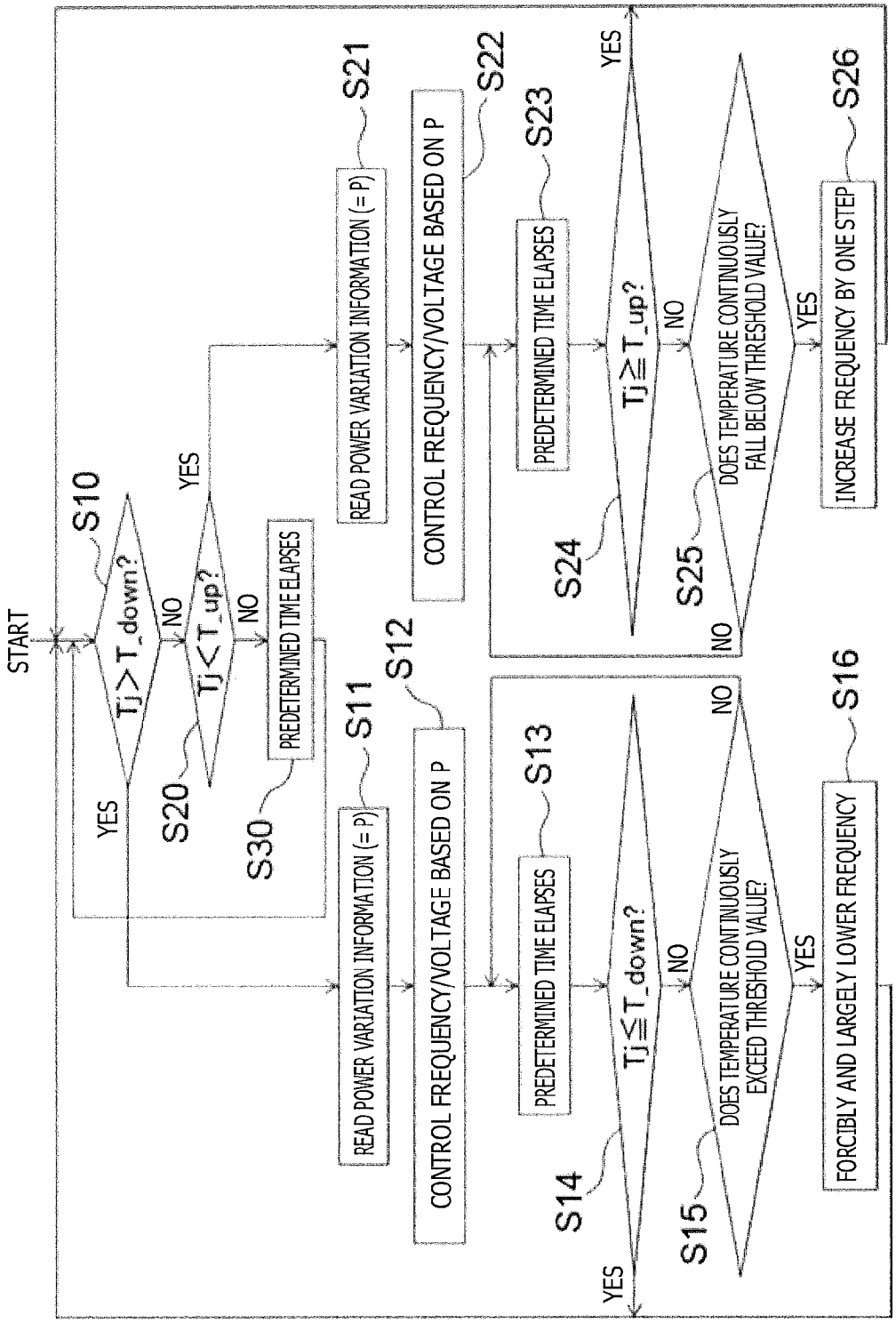
FIG. 11 is a flowchart illustrating a control procedure of a voltage/frequency control unit.

FIG. 11 is a flowchart illustrating the aforementioned control procedure of the voltage/frequency control unit 13.

In step S10, it is determined whether a detected temperature Tj is greater than T_down. When the temperature Tj is greater than T_down, the process proceeds to step S11. When the temperature Tj is smaller than T_down, the process proceeds to step S20.

In step S20, it is determined whether the detected temperature Tj is smaller than T_up. When the temperature Tj is smaller than T_up, the process proceeds to step S21. When the temperature Tj is greater than T_up, the process proceeds to step S30.

In step S30, the process waits until a predetermined time elapses and thereafter returns to step S10.

In step S11, power variation information P is read.

In step S12, the clock frequency and the power supply voltage are controlled based on the power variation information P.

In step S13, the process waits until a predetermined time elapses and thereafter proceeds to step S14.

In step S14, it is determined whether a newly detected temperature Tj is smaller than or equal to T_down. When the temperature Tj is smaller than or equal to T_down, the process returns to step S10. When the temperature Tj is greater than T_down, the process proceeds to step S15.

In step S15, it is determined whether the temperature Tj continuously exceeds the temperature threshold value T_down for a certain period of time. When the temperature Tj continuously exceeds the temperature threshold value for the certain period of time, the process proceeds to step S16. When the temperature Tj does not continuously exceed the temperature threshold value for the certain period of time, the process returns to step S13.

In step S16, the clock frequency is forcibly and largely lowered and then the process returns to step S10. Thereby, it is controlled so that the load (power consumption) is largely reduced and the temperature is lowered. However, there is a time delay in practice, so that steps S10 to S16 are repeatedly performed until the temperature actually lowers.

In step S21, power variation information P is read.

In step S22, the clock frequency and the power supply voltage are controlled based on the power variation information P.

In step S23, the process waits until a predetermined time elapses and thereafter proceeds to step S24.

In step S24, it is determined whether a newly detected temperature Tj is greater than or equal to T_up. When the temperature Tj is greater than or equal to T_up, the process returns to step S10. When the temperature Tj is smaller than T_up, the process proceeds to step S25.

In step S25, it is determined whether the temperature Tj continuously falls below the temperature threshold value T_up for a certain period of time. When the temperature Tj continuously falls below the temperature threshold value for the certain period of time, the process proceeds to step S26. When the temperature Tj does not continuously fall below the temperature threshold value for the certain period of time, the process returns to step S23.

In step S26, the clock frequency is increased by one step and then the process returns to step S10. Thereby, it is controlled so that the load (power consumption) is increased by one step and the temperature is raised. However, there is a time delay in practice, so that steps S10 and S20 to S26 are repeatedly performed until the temperature actually rises.

Figure 12:
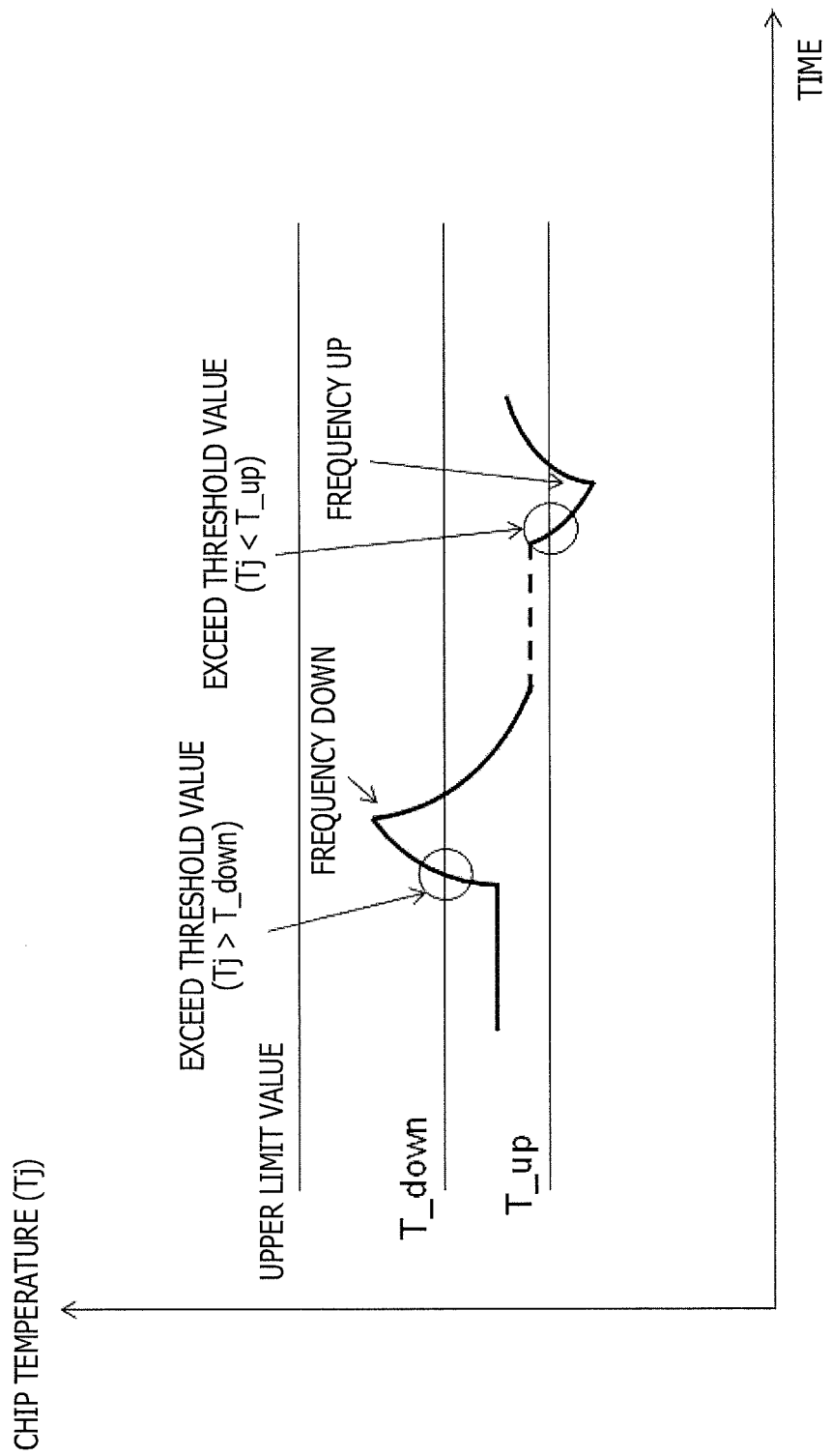
FIG. 12 is a diagram illustrating an example of a temperature variation when a control method of FIG. 11 is performed.

FIG. 12 is a diagram illustrating an example of the temperature variation when the control method of FIG. 11 is performed.

As illustrated in FIG. 12, when the temperature rises exceeding the temperature threshold value T_down, the clock frequency is largely decreased in step S16, so that the temperature begins to fall after a certain delay time. When the temperature falls below the temperature threshold value T_up, one-step increase of the clock frequency in step S26 is repeatedly performed, so that the temperature begins to rise after a certain delay time.

When the temperature threshold values T_down and T_up are the same value, the temperature repeatedly rises and falls from the temperature threshold value.

In the control method of FIG. 11, when an unexpectedly large power is consumed or when a much larger load variation occurs during the clock frequency control, there is a probability that the temperature exceeds the upper limit value and a malfunction occurs. Therefore, two-step power control can be considered in which one more threshold value (temporarily referred to as T_down2) is set between the temperature upper limit value and T_down in addition to the threshold values T_down and T_up and when the temperature exceeds the threshold value T_down2, the load (power consumption) is further decreased by performing quick load reduction. For the quick load reduction, there are a method in which a logical operation such as thinning of clock pulses and forcible reduction of the number of instructions issued at the same time is used and a method in which the clock frequency is lowered to a safe and sufficiently low frequency (normally, the lowest operating frequency) that can cope with an expected maximum load, and these methods are used concurrently.

Figure 13:
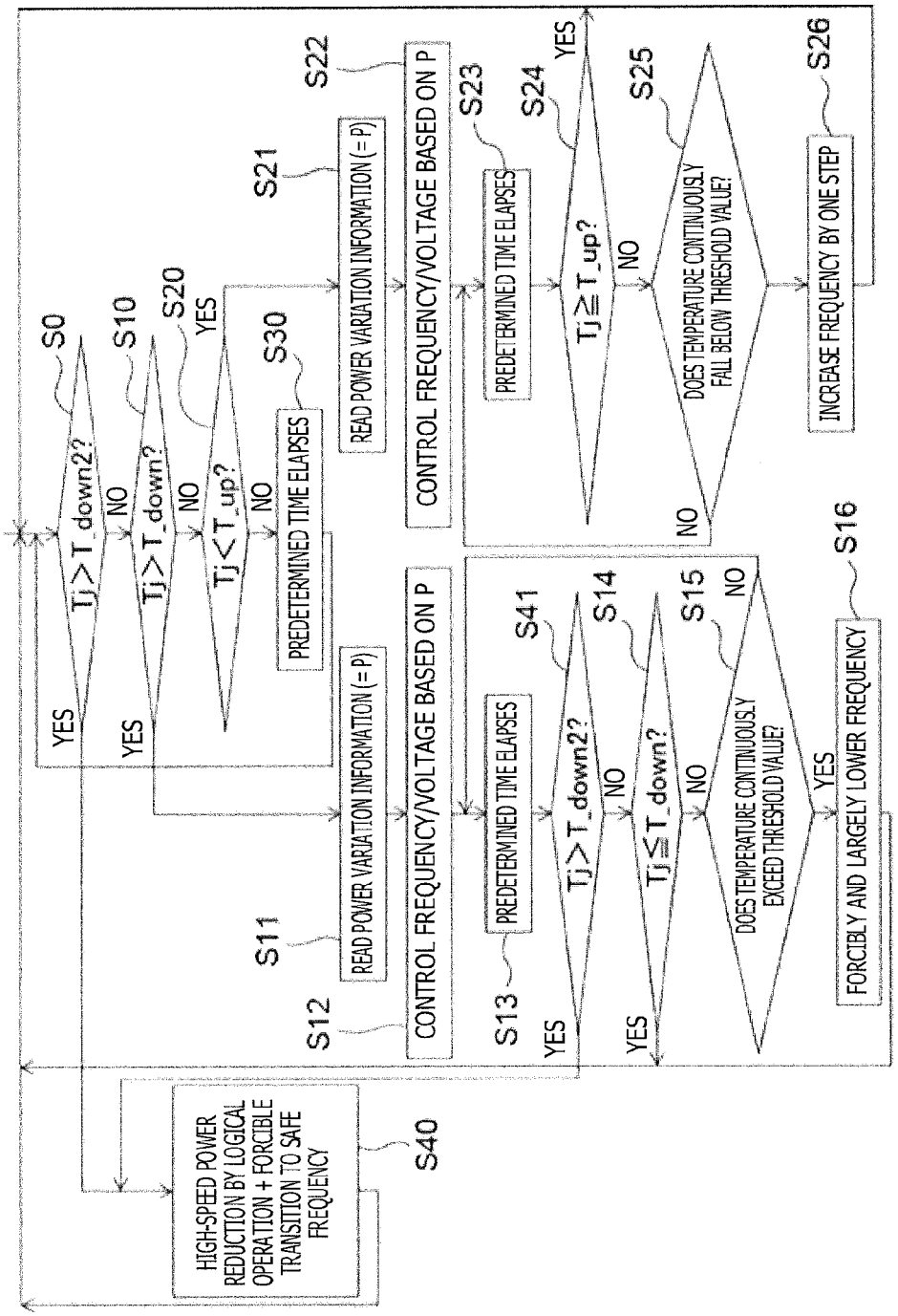
FIG. 13 is a flowchart illustrating a control procedure of a voltage/frequency control unit when another temperature threshold value is further set.

FIG. 13 is a flowchart illustrating a control procedure of the voltage/frequency control unit 13 when the temperature threshold value T_down2 is further set.

The control method of FIG. 13 is different from that of FIG. 11 in that steps S0, S40, and S41 are provided.

Step S0 is performed before step S10 and it is determined whether a detected temperature Tj is greater than T_down2. When the temperature Tj is greater than T_down2, the process proceeds to step S40. When the temperature Tj is smaller than T_down2, the process proceeds to step S10. Steps after S10 are the same as those in FIG. 11 except that step S41 is provided.

In step S40, the method that uses the logical operation and the method that lowers the clock frequency to a safe frequency are forcibly performed. Thereby, the load (power consumption) rapidly lowers and also the temperature falls. After step S40, the process returns to step S0.

Step S41 is performed between steps S13 and S14. In step S41, it is determined whether a detected temperature Tj is greater than T_down2. When the temperature Tj is greater than T_down2, the process proceeds to step S40. When the temperature Tj is smaller than T_down2, the process proceeds to step S14.

Figure 14:
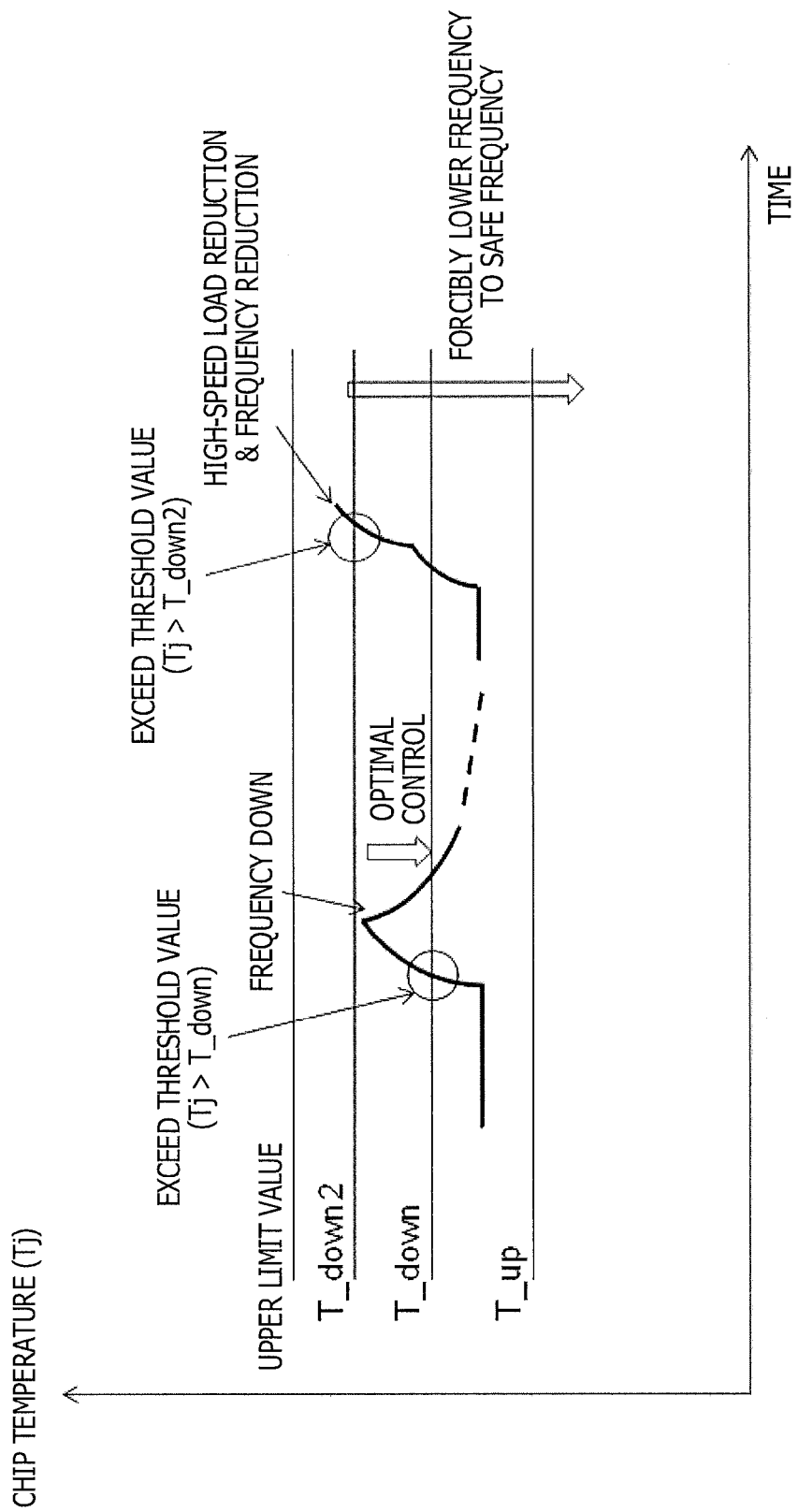
FIG. 14 is a diagram illustrating an example of a temperature variation when a control method of FIG. 13 is performed.

FIG. 14 is a diagram illustrating an example of the temperature variation when the control method of FIG. 13 is performed.

As illustrated in FIG. 14, when the temperature rises exceeding the temperature threshold value T_down, the clock frequency is largely decreased and the temperature begins to fall as illustrated in FIG. 12. Further, when the temperature rises exceeding the temperature threshold value T_down and further rises exceeding T_down2, the load (power consumption) is rapidly reduced and the temperature rapidly falls accordingly.

FIG. 15 is a diagram illustrating an example of a table for deriving a clock frequency of the PLL 11 which is finally adjusted.

The clock frequency of the PLL 11 which is finally adjusted is obtained by new frequency=f+Δf=f(1−ΔP/P). Therefore, a frequency derivation table and a frequency/voltage derivation table as illustrated in FIGS. 15A and 15B are prepared and the frequency is obtained. FIG. 15A represents association between a frequency which the clock of a frequency control target processor may have and an internal use code corresponding to the frequency. FIG. 15B is a table used when the processor also controls the power supply voltage through the power supply control unit 12. In FIG. 15B, frequency/voltage are associated with the aforementioned code.

Figure 16:
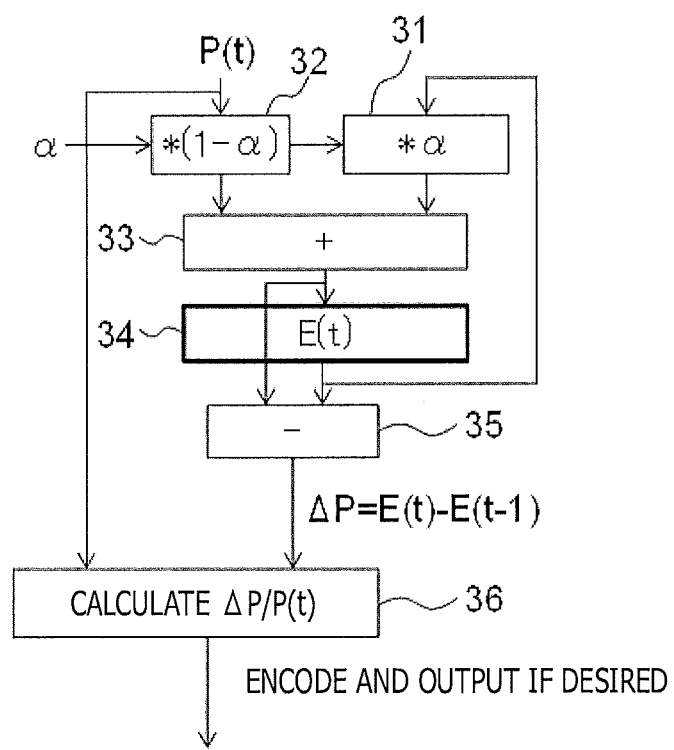
FIG. 16 is a diagram illustrating an example of a circuit that calculates a difference ΔP/P of a power value.

FIG. 16 is a diagram illustrating an example of a circuit that calculates ΔP/P of the above formula.

The circuit of FIG. 16 is a circuit in which a divider 36 that calculates a ratio ΔP/P between an output of the subtracter 35 and P(t) is added to the circuit of FIG. 9. Here, for convenience of description, it is assumed that an output of the divider 36 is represented by numerical values −6, −5, . . . , 5, 6 according to the magnitude of calculated value.

FIG. 17 illustrates a frequency conversion table used for control to lower the clock frequency.

FIG. 18 illustrates a frequency conversion table used for control to raise the clock frequency.

For example, it is assumed that the load increases in a state in which the clock frequency is 4 (code value) and the temperature rises exceeding T_down at a certain time point. If the value of ΔP/P at this time is 2, the voltage/frequency control unit 13 obtains a new frequency from the table of FIG. 17. In FIG. 17, the value of a position of ΔP/P=2 and the frequency code=4 is 1, so that the voltage/frequency control unit 13 lowers the frequency to 1. Further, it is assumed that the load decreases in a state in which the clock frequency is 2 (code value) and the temperature falls below T_up. If the value of ΔP/P at this time is −4, the voltage/frequency control unit 13 obtains a new frequency from the table of FIG. 18. In FIG. 18, the value of a position of ΔP/P=−4 and the frequency code=2 is 7, so that the voltage/frequency control unit 13 raises the frequency to 7.

As described above, when the temperature rises exceeding the temperature threshold value T_down2 and when the load increases excessively, it is desirable to set the frequency to lower than normally used frequency and quickly reduce the load.

FIG. 19 illustrates an example of a table used to quickly lower the frequency in this way.

In the table of FIG. 19, the values of frequency codes are smaller than those in the table of FIG. 18. The usage of the table of FIG. 19 is the same as that of FIG. 18, so that the description will be omitted.

In a semiconductor device, power gating is performed in which inside of the semiconductor device is divided into a plurality of blocks, the supply of power supply voltage is controlled for each block, and leakage power is reduced for each block. The leakage power changes after the temperature changes, so that when the target processor does not perform the power gating, the leakage power does not have to be considered. Therefore, the power monitor 21 may be formed by a general dynamic power monitor that obtains a power value by multiplying an operation rate of a main signal of the chip acquired by an activity counter by appropriate coefficient values and calculates the sum of the multiplication results as illustrated in FIG. 5. However, when the target processor performs the power gating and can block the power supply to some blocks, the leakage power of the blocks rapidly changes independent from the temperature. In this case, the power monitor as illustrated in FIG. 5 is not able to accurately detect the power.

Figure 20:
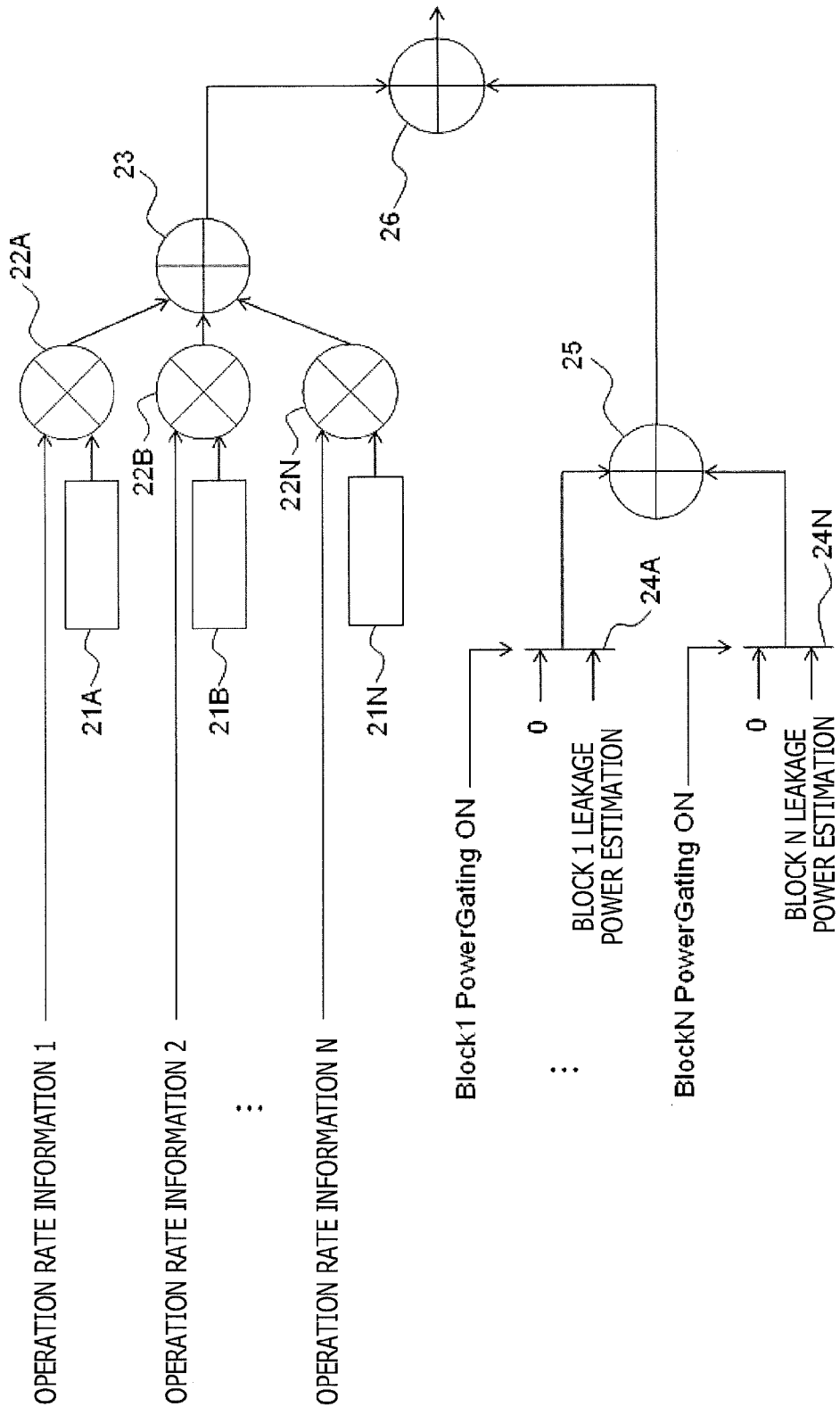
FIG. 20 is a diagram illustrating a configuration of a power monitor in a case in which a target processor performs power gating.

FIG. 20 is a diagram illustrating a configuration of the power monitor 21 in a case in which the target processor performs the power gating.

As illustrated in FIG. 20, the power monitor 21 includes selectors 24A to 24N, an adder 25, and an adder 26 in addition to the configuration of FIG. 5. When power is supplied to a corresponding block, the selectors 24A to 24N select zero, and when power is not supplied to a corresponding block, the selectors 24A to 24N select an estimate of leakage power of each block. When power is supplied to a block, only the power consumption of the block is added by the operation rate information. When power is not supplied to a block, the operation rate information is zero. However, there is leakage power, so that the leakage power is taken into account by selecting the estimate of the leakage power by the selector. In this way, the power monitor 21 of FIG. 20 monitors power including variation of leakage power of a module subject to the power gating.

The frequency control method of the semiconductor device (processor) of the embodiment described above may be used along with frequency control by software. For example, it can be considered that control by software mode and hardware control are switched when the software writes operation mode information into a certain mode register.

Figure 21:
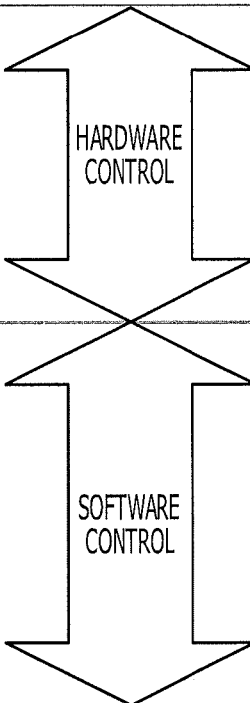
FIG. 21 illustrates an example of a table in which a frequency code, a type (hardware or software) of frequency control method, and a clock frequency are associated with each other in a case in which software control is performed in a frequency domain of low load and hardware control is performed in a frequency domain of high load.

FIG. 21 illustrates an example of a table in which a frequency code, a type (hardware or software) of the frequency control method, and a clock frequency are associated with each other in a case in which software control is performed in a frequency domain of low load and hardware control is performed in a frequency domain of high load.

The usage of FIG. 21 is the same as that of FIGS. 18 and 19, so that the description will be omitted.

Further, an operation can be considered in which when mode 0 is set by software control, control is automatically switched to hardware control. When switching to the software control or cooperating with the software control, a function to disable a mechanism of hardware control in a case of the software control mode is provided. However, even in the case of software control, the condition in which when the temperature exceeds the temperature upper limit, malfunction occurs does not change, so that it is desirable to take measures to enable the aforementioned threshold value for forcibly reducing the load and forcibly reduce the load before the temperature exceeds the temperature upper limit.

As described above, in a semiconductor device having an operating condition in which an operation guarantee temperature condition determines the maximum allowable load, a margin between the temperature upper limit and the control threshold value is set to a value close to a maximum temperature change in a frequency control delay. According to the embodiment, also in this case, it is possible to suppress useless reduction of the frequency when the temperature exceeds the control threshold value and improve performance.

FIGS. 22A and 22B are diagrams for explaining effects of control of the embodiment in a case in which the temperature rises to exceed the temperature threshold value and the clock frequency is lowered. FIG. 22A illustrates a temperature variation in a case in which control is performed using only temperature. FIG. 22B illustrates a temperature variation in a case of the control of the embodiment.

It is assumed that there is a processor in which the maximum clock frequency is 3 GHz, the minimum clock frequency is 1.3 GHz, and the clock frequency can be adjusted to a value between the maximum and the minimum clock frequencies, and when the processor performs processing consuming the largest power, the temperature exceeds an operational upper limit value unless the frequency is lowered to 1.3 GHz. Here, a case will be considered in which processing of the following three loads is performed: a load a where the power consumption is large and the temperature exceeds the upper limit unless the frequency is lowered to 1.3 GHz, an intermediate load b where the temperature exceeds the upper limit unless the frequency is lowered to 2.0 GHz, and a small load c where the temperature does not exceed the upper limit when the frequency is lowered to 2.3 GHz.

First, when the frequency is controlled by using only temperature, as illustrated in FIG. 22A, in any case of the loads a, b, and c, when the temperature exceeds the temperature threshold value, the frequencies are uniformly lowered to 1.3 GHz so that the temperature does not exceed the upper limit even when the load increases in the worst case. The clock frequency that is too much lowered is gradually returns to an appropriate frequency by, for example, separately setting a threshold value to raise the frequency and performing control.

On the other hand, in the embodiment, as illustrated in FIG. 22B, the frequency is adjusted so that useless reduction of frequency does not occur as much as possible according to the power variation amount at a time point when the temperature exceeds the temperature threshold value, so that the frequency is adjusted to a value around 2.0 GHz in the case of load b, and the frequency is adjusted to a value around 2.6 GHz in the case of load c. As described above, in the embodiment, transitional and useless degradation of performance is largely suppressed.

Figure 23B:
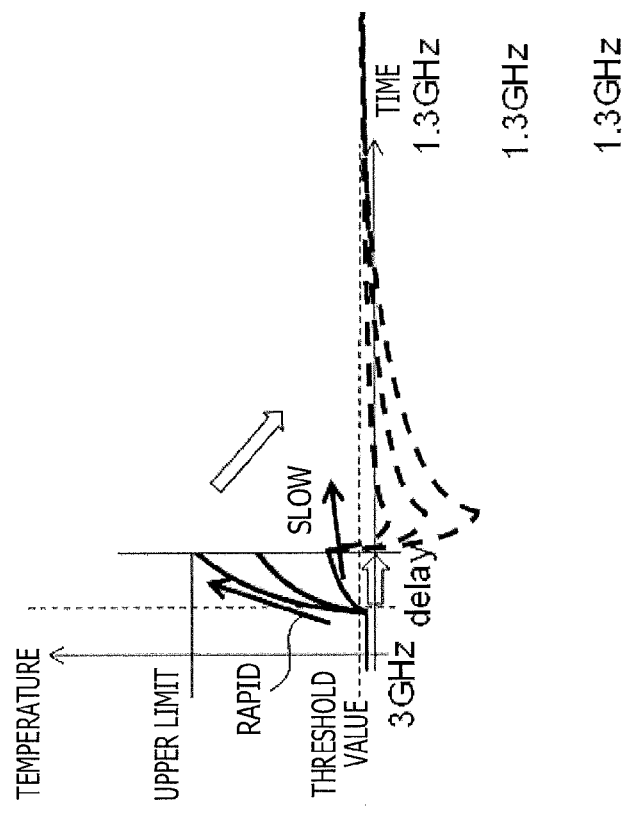
FIGS. 23A and 23B are diagrams for explaining effects of control of the embodiment in a case in which the temperature falls to fall below a temperature threshold value and the clock frequency is raised.
Figure 23A:
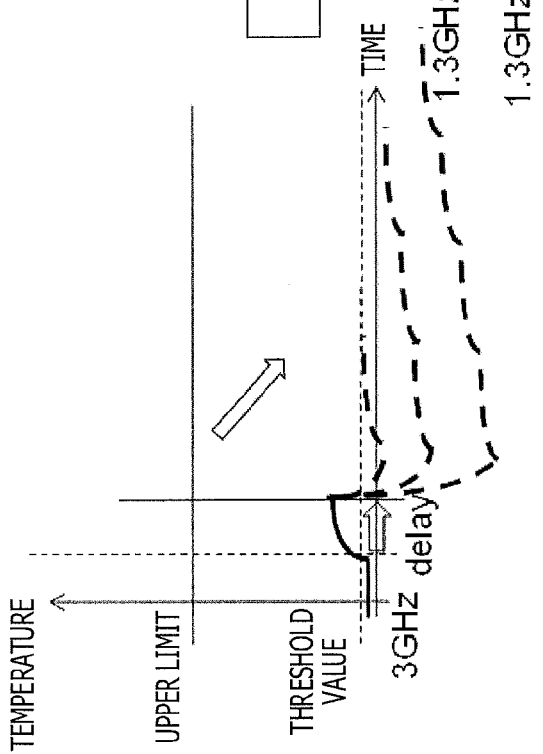

FIGS. 23A and 23B are diagrams for explaining effects of control of the embodiment in a case in which the temperature falls below the temperature threshold value and the clock frequency is raised. FIG. 23A illustrates a temperature variation in a case in which control is performed using only temperature. FIG. 23B illustrates a temperature variation in a case of the control of the embodiment.

When the frequency is controlled by using only temperature, as illustrated in FIG. 23A, when the load is reduced and the temperature falls below the temperature threshold value, it is not known how much the temperature falls eventually, so that the frequency is raised little by little and step by step so that the temperature is not reversed too much and does not exceed the temperature upper limit.

On the other hand, in the embodiment, as illustrated in FIG. 23B, the clock frequency rises according to the falling degree of the temperature at a time point when the temperature falls below the temperature threshold value. Therefore, the temperature rises more quickly to a temperature close to the temperature threshold value, so that it is possible to shorten a period of time in which the temperature falls largely below the temperature threshold value, in other words, a period of time in which the performance is uselessly degraded.

The effects described above are an improvement of transient performance. However, in a program in which load variation frequently occurs, such a transient performance improvement leads to a general performance improvement.

The semiconductor device of the embodiment described above is a microprocessor in which one processor (CPU) is mounted on a chip, as illustrated in FIG. 4. However, in recent years, a multi-core processor in which a plurality of core processors are mounted is widely used. Although the control method of the embodiment can be applied to the multi-core processor, there may be a plurality of modified examples for a configuration to be applied. Hereinafter, some of the modified examples will be described.

Figure 24:
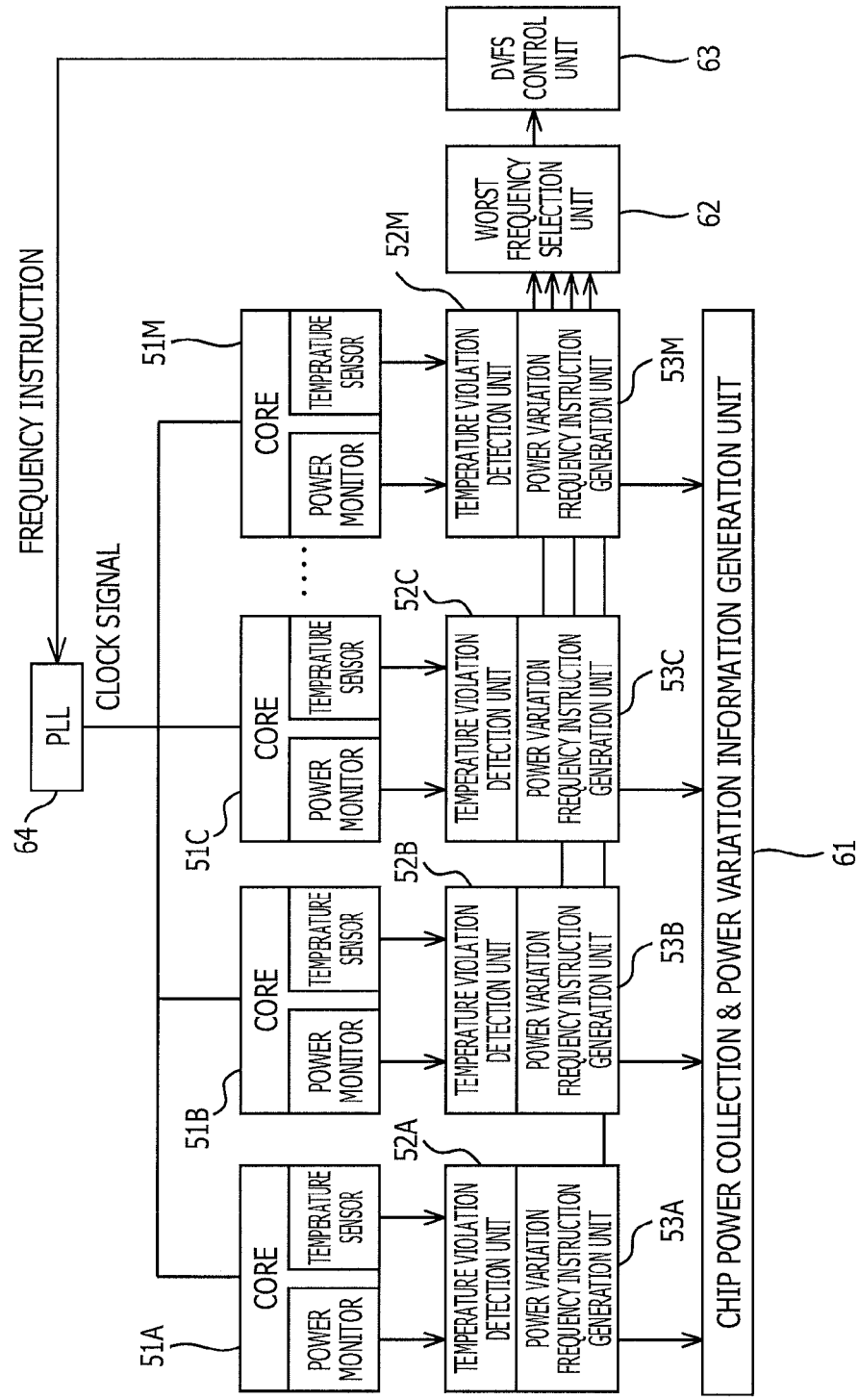
FIG. 24 is a diagram illustrating a first configuration example of a multi-core processor to which the control method of the embodiment is applied.

FIG. 24 is a diagram illustrating a first configuration example of a multi-core processor to which the control method of the embodiment is applied.

The multi-core processor of the first configuration example includes a plurality of core processors 51A to 51M, each of which includes a power monitor and a temperature sensor. The plurality of core processors 51A to 51M operate by a common clock supplied from a PLL 64. Therefore, the plurality of core processors 51A to 51M operate in synchronization.

The multi-core processor of the first configuration example further includes temperature violation detection units 52A to 52M, power variation frequency instruction generation units 53A to 53M, a chip power collection & power variation information generation unit 61, a worst frequency selection unit 62, a DVFS control unit 63, and a PLL 64. A combination of the temperature violation detection unit and the power variation frequency instruction generation unit performs the control method of the embodiment on each core processor and generates a clock frequency and a power supply voltage control signal for each core processor.

The multi-core processor of the first configuration example performs control of the entire chip by taking the clock frequency and the power supply voltage control signal for each core processor into account. The clock frequency commonly supplied from the PLL 64 is matched with the worst (minimum) clock frequency of the clock frequencies generated by the power variation frequency instruction generation units 53A to 53M. Therefore, the worst frequency selection unit 62 selects the worst clock frequency from the clock frequencies outputted from the plurality of power variation frequency instruction generation units 53A to 53M.

In the first configuration example, further, the selection of the worst clock frequency in the worst frequency selection unit 62 is changed by considering the power consumption and the power variation in the entire chip. For example, when the entire power consumption is large, a lowest clock frequency is selected, which is lower than the worst clock frequency of the clock frequencies outputted from the plurality of power variation frequency instruction generation units 53A to 53M. When a clock frequency indicated by one power variation frequency instruction generation unit is low and the clock frequency is selected as the worst clock frequency but the temperature and the power consumption of other core processors are low, there may be a case in which the clock frequency can be increased a little by reason of thermal diffusion. In such a case, the worst frequency selection unit 62 selects a clock frequency one step larger than the worst clock frequency.

The DVFS control unit 63 controls the PLL 64 so as to output the clock frequency selected by the worst frequency selection unit 62.

Figure 25:
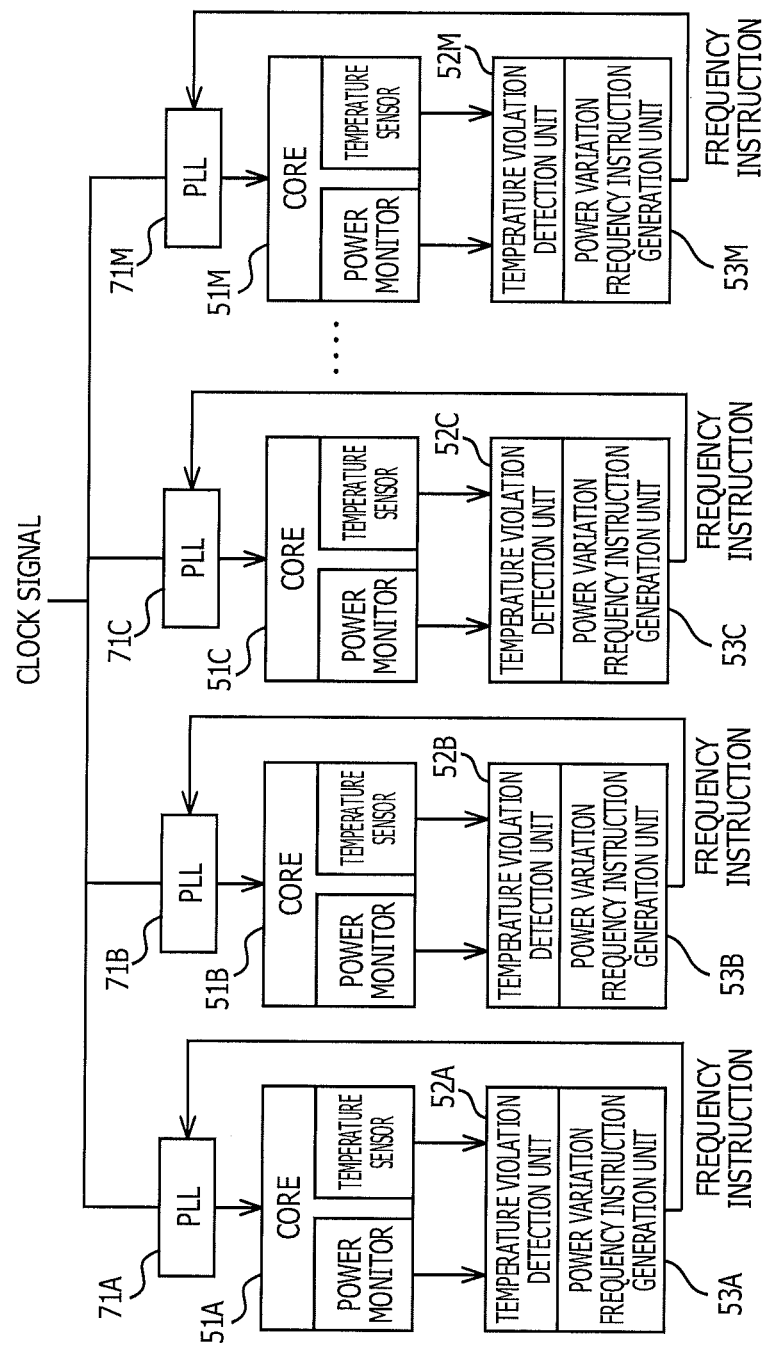
FIG. 25 is a diagram illustrating a second configuration example of a multi-core processor to which the control method of the embodiment is applied.

FIG. 25 is a diagram illustrating a second configuration example of a multi-core processor to which the control method of the embodiment is applied.

The multi-core processor of the second configuration example includes a plurality of PLLs 71A to 71M, a plurality of core processors 51A to 51M, each of which includes a power monitor and a temperature sensor, temperature violation detection units 52A to 52M, and power variation frequency instruction generation units 53A to 53M. The plurality of PLLs 71A to 71M adjust a commonly supplied clock signal and generate an individual clock to be supplied to the plurality of core processors 51A to 51M. Therefore, the plurality of core processors 51A to 51M are not able to operate in synchronization. The core processors 51A to 51M individually perform assigned processing and send completion information to a master processor (one of the plurality of core processors) when the processing is completed.

In the multi-core processor of the second configuration example, each combination of one of the temperature violation detection units 52A to 52M and one of the power variation frequency instruction generation units 53A to 53M controls the clock frequency of a corresponding PLL according to the temperature and the power variation of a corresponding core processor in the same manner as in the embodiment.

Figure 26A:
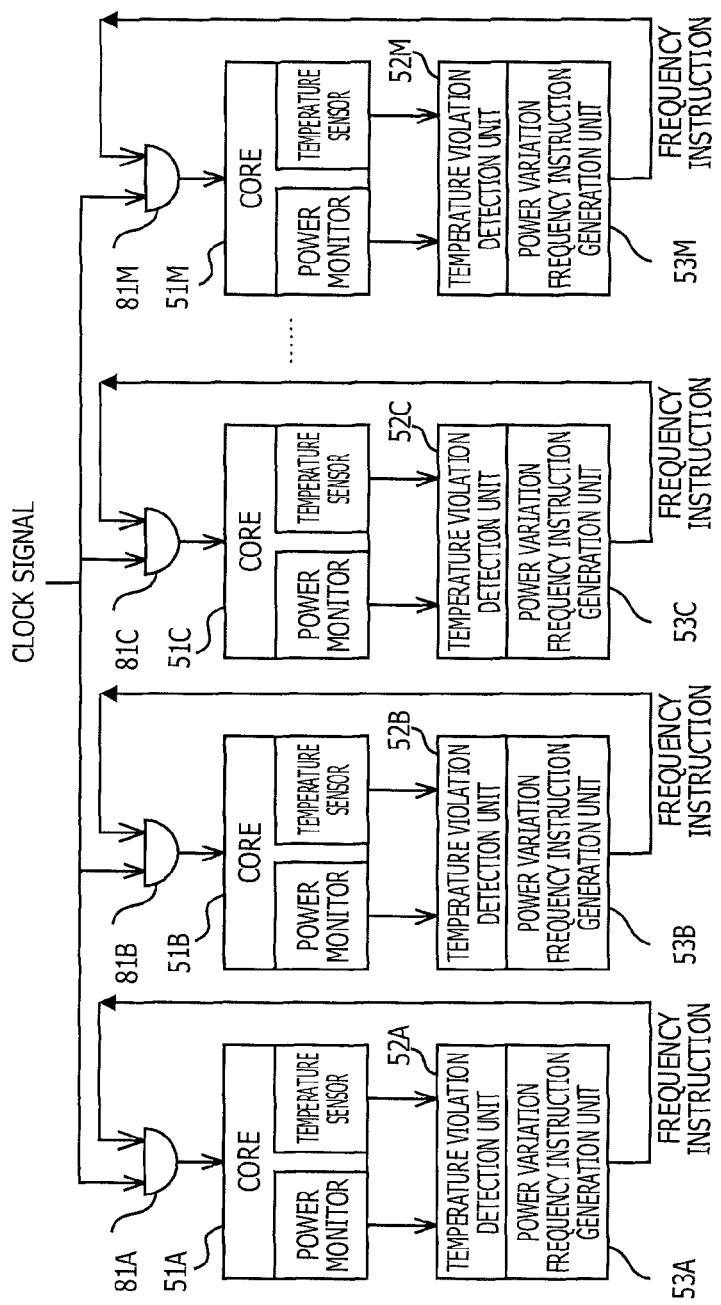
FIGS. 26A and 26B are diagrams illustrating a third configuration example of a multi-core processor to which the control method of the embodiment is applied.
Figure 26B:
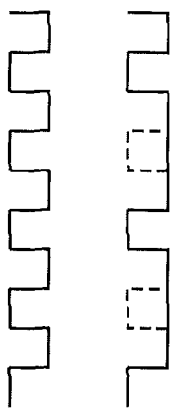

FIGS. 26A and 26B are diagrams illustrating a third configuration example of a multi-core processor to which the control method of the embodiment is applied. FIG. 26A is a block diagram illustrating a circuit configuration. FIG. 26B illustrates an example of a clock supplied to a core processor.

The multi-core processor of the third configuration example includes AND gates 81A to 81M, core processors 51A to 51M, each of which includes a power monitor and a temperature sensor, temperature violation detection units 52A to 52M, and power variation detection cycle thinning instruction generation units 53A to 53M.

In the second configuration example, the plurality of PLLs 71A to 71M adjust a commonly supplied clock signal and generate an individual clock to be supplied to the plurality of core processors 51A to 51M. However, the circuit configuration of the PLL is complicated and when a plurality of PLLs are provided, the circuit scale becomes large. Therefore, in the third configuration example, the AND gates 81A to 81M practically adjust the clock frequency by thinning pulses of the clock signal according to a frequency instruction from the power variation detection cycle thinning instruction generation units 53A to 53M.

Also in the first to the third configuration example, it is possible to control not only the clock frequency, but also the power supply voltage.

While the embodiment and the configuration examples have been described, the control may be performed with respect to only the clock frequency or may be performed with respect to both the clock frequency and the power supply voltage.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A semiconductor device comprising:
   a circuit configured to operate according to a clock;
   a temperature sensor configured to detect a temperature of the circuit; and
   a controller configured to
     control a frequency of the clock based on a temporal difference of power consumption of the circuit when the temperature detected by the temperature sensor exceeds a predetermined value,
     calculate an exponential moving average of power from acquired power values based on a variation of the power value up to this time and an elapsed time until this time, and
     control the frequency of the clock based on a temporal difference of the exponential moving average.

2. The semiconductor device according to claim 1, wherein
   the controller is further configured to control a power supply voltage along with the clock frequency and change the clock frequency and the power supply voltage based on temporal difference of the exponential moving average when the temperature detected by the temperature sensor exceeds a predetermined upper limit.

3. The semiconductor device according to claim 2, wherein
   the predetermined upper limit is set so that the predetermined upper limit becomes largest in a range not exceeding a temperature limit even when power consumption of the semiconductor device becomes maximum power consumption.

4. The semiconductor device according to claim 1, wherein
   the controller is further configured to change the clock frequency based on the variation of the power value when the temperature detected by the temperature sensor falls below a predetermined lower limit.

5. A control method of a clock frequency of a semiconductor device including circuits that operates according to a clock, the control method comprising:
   detecting a temperature of the circuits;
   monitoring power consumption of the circuits;
   calculating a temporal difference of the monitored power consumption;

changing the clock frequency based on the temporal difference of the power consumption when the detected temperature exceeds a predetermined upper limit;
calculating an exponential moving average of power from acquired power values based on a variation of the power value up to this time and an elapsed time until this time; and
controlling the clock frequency based on a temporal difference of the exponential moving average.

\* \* \* \* \*